United States Patent
May

(10) Patent No.: US 6,714,309 B2
(45) Date of Patent: Mar. 30, 2004

(54) METHOD AND SYSTEM FOR LOCKING TRANSMISSION WAVELENGTHS FOR LASERS IN A DENSE WAVELENGTH DIVISION MULTIPLEXER

(75) Inventor: Randy Dean May, Montrose, CA (US)

(73) Assignee: SpectraSensors, Inc., Altadena, CA (US)

(*) Notice: Subject to any disclaimer, the term of this patent is extended or adjusted under 35 U.S.C. 154(b) by 399 days.

(21) Appl. No.: 09/775,772

(22) Filed: Jan. 31, 2001

(65) Prior Publication Data

US 2002/0163650 A1 Nov. 7, 2002

Related U.S. Application Data

(63) Continuation-in-part of application No. 09/685,212, filed on Oct. 10, 2000.

(51) Int. Cl.$^7$ ................................................ G01B 9/02
(52) U.S. Cl. ........................................ 356/519; 372/32
(58) Field of Search ................................ 356/519, 454; 372/32; 359/247

(56) References Cited

U.S. PATENT DOCUMENTS

| | | |
|---|---|---|
| 4,468,773 A | 8/1984 | Seaton |
| 4,583,228 A * | 4/1986 | Brown et al. .............. 372/32 |
| 4,689,794 A | 8/1987 | Brosnan |
| 4,737,798 A | 4/1988 | Lonis et al. |
| 4,815,081 A | 3/1989 | Mahlein et al. |
| 4,821,273 A | 4/1989 | Hori |
| 4,913,525 A | 4/1990 | Asakura |
| 4,947,398 A * | 8/1990 | Yasuda et al. ......... 372/29.021 |
| 4,955,027 A | 9/1990 | Piper et al. |
| 4,955,029 A | 9/1990 | Lecoy |
| 4,982,406 A | 1/1991 | Facklam |
| 5,042,042 A | 8/1991 | Hori |
| 5,068,864 A | 11/1991 | Javan |
| 5,208,819 A | 5/1993 | Huber |
| 5,287,367 A | 2/1994 | Yanagawa |
| 5,299,212 A | 3/1994 | Koch |

(List continued on next page.)

OTHER PUBLICATIONS

Randy D. May, The Optogalvanic Effect, University of North Carolina, 1985. Appendix A, USA.

(List continued on next page.)

Primary Examiner—Samuel A. Turner
(74) Attorney, Agent, or Firm—Carl A. Kukkonen, III

(57) ABSTRACT

The method and system operate to calibrate a transmission laser of the dense wavelength division multiplexer (DWDM) and to lock the laser to a selected transmission wavelength. In one example, the transmission laser is a widely tunable laser (WTL) to be tuned to one of a set of International Telecommunications Union (ITU) transmission grid lines for transmission through an optic fiber. To lock the WTL to an ITU grid line, a portion of the output beam from the WTL is routed through the etalon to split the beam into a set of transmission lines for detection by a detector. Another portion of the beam is routed directly to another detector. A wavelength-locking controller compares signals from the two detectors and adjusts the temperature of the etalon to align the wavelength of one of the transmission lines of the etalon with the wavelength of the output beam, then controls the WTL in a feedback loop to lock the laser to the etalon line. The wavelength-locking controller thereafter monitors the temperature of the etalon and keeps the temperature constant to prevent any wavelength drift in the etalon. In one example, the etalon is a silicon etalon configured to have finesse of about 20 and to provide a free spectral range of about 8 GHz. With these parameters, the system is able to lock the wavelength of the WTL to within a precision of about 0.2 GHz.

33 Claims, 16 Drawing Sheets

U.S. PATENT DOCUMENTS

| | | |
|---|---|---|
| 5,313,480 A | 5/1994 | Fidric |
| 5,323,409 A | 6/1994 | Laskoskie |
| 5,428,700 A | 6/1995 | Hall |
| 5,509,022 A | 4/1996 | Lowery et al. |
| 5,544,183 A | 8/1996 | Takeda |
| 5,577,059 A | 11/1996 | Lee |
| 5,627,648 A | 5/1997 | Garrett |
| 5,633,883 A | 5/1997 | Shi et al. |
| 5,691,989 A | 11/1997 | Rakuljic |
| 5,706,301 A | 1/1998 | Lagerstrom |
| 5,780,843 A | 7/1998 | Cliche |
| 5,781,572 A | 7/1998 | Tahara |
| 5,798,859 A | 8/1998 | Colbourne et al. |
| 5,825,792 A | 10/1998 | Villeneuve |
| 5,867,513 A | 2/1999 | Sato |
| 5,915,052 A | 6/1999 | Ball |
| 6,078,418 A | 6/2000 | Hansen et al. |
| 6,088,142 A | 7/2000 | Cao et al. |
| 6,101,200 A | 8/2000 | Burbidge et al. |
| 6,122,301 A | 9/2000 | Tei et al. |
| 6,125,128 A | 9/2000 | Mizrahi |
| 6,134,253 A | 10/2000 | Munks et al. |
| 6,151,340 A | 11/2000 | Rivers |
| 6,181,717 B1 | 1/2001 | Kner et al. |
| 6,222,861 B1 | 4/2001 | Kuo et al. |
| 6,240,109 B1 | 5/2001 | Shieh |
| 6,243,403 B1 * | 6/2001 | Broutin et al. .............. 372/32 |

OTHER PUBLICATIONS

Randy D. May, Correlation–based technique for automated tunable diode laser scan stabilization, Rev. Sci. Instrum–vol. 63 (5), 2922–2926 May 1992, USA.

Tatsuno et al., 50 GHz Spacing, Multi–Wavelength Tunable Locker . . . Unknown.

Yvonne Carts–Powell, Silicon FP interferometer provides tuning and Filtering for DWDM, WDM Solutions, Jun. 2001.

T. Niemi et al., Wavelength monitoring of multi–channel DWDM–systems using a single temperature–tunable Fabry–Perot filter, Unknown.

Don G. Peterson & Amnon Yariv, Interferometry and Laser Control with solid Fabry–Perot Etalons, Applied Optics, Jun. 1966, vol. 5, No. 6.

Tapio Niemi et al., Tunable Silicon Etalon for Simultaneous Spectral Filtering and Wavelength . . . IEEE Photonics Technology Letters, Jan. 2001, vol. 13, No. 1.

* cited by examiner

METHOD AND SYSTEM FOR LOCKING TRANSMISSION WAVELENGTHS FOR LASERS IN A DENSE WAVELENGTH DIVISION MULTIPLEXER

RELATED APPLICATIONS

This patent application is a Continuation-in-Part of U.S. patent application Ser. No. 09/685,212, of Randy May entitled "Method And Apparatus For Determining Transmission Wavelengths For Lasers In A Dense Wavelength Division Multiplexer", filed Oct. 10, 2000.

BACKGROUND OF THE INVENTION

1. Field of the Invention

The invention generally relates to dense wavelength division multiplexers (DWDM) and in particular to a technique for locking transmission wavelengths of individual lasers of the DWDM.

2. Description of the Related Art

A DWDM is a device for simultaneously transmitting a set of discrete information channels over a single fiber optic transmission line. A conventional fiber optic transmission line is capable of reliably transmitting signals within a bandwidth of 1280 to 1625 nanometers (nm), the "low loss" region for silica fiber. Within that overall bandwidth, the International Telecommunications Union (ITU) has defined various transmission bands and specified certain transmission channel protocols for use within each transmission band. One example of a transmission band is the ITU "C" band, which extends 40 nm from 1525 nm to 1565 nm. Within the C band, specific transmission channel protocols of 40, 80, or 160 discrete channels are defined and, for each protocol, the ITU has defined a grid of transmission wavelengths, with each line corresponding to an acceptable transmission wavelength. The protocols have been defined to ensure that all DWDM transmission and reception equipment are fabricated to operate at the same wavelengths. For the 40-channel protocol, the corresponding ITU grid has 40 lines with channel spacing of 0.8 nm; for the 80-channel protocol, the corresponding ITU grid has 80 lines with channel spacing of 0.4 nm; and so forth. Additional protocols have been proposed, including 320 channel and 640 channel protocols. Maximum theoretical transmission frequencies for the various ITU protocols are as follows: 100 GHz for the 40 channel protocol; 50 GHz for the 80 channel protocol; 25 GHz for the 160 channel protocol; 12.5 GHz for the 320 channel protocol; and 6.25 GHz for the 640 channel protocol. Closer channel spacing necessitates a lower modulation rate since channel spacing must be larger than the modulation frequency. High frequency modulation requires suitable optic fibers, as well as appropriate transmission and receiving equipment. Current state-of-the-art DWDMs typically employ a 40 channel ITU protocol but transmit at 2.5 GHz, well below the theoretical maximum. Other exemplary ITU transmission bands are the S- and L-bands.

To simultaneously transmit the set of channels on a fiber optic cable, a conventional DWDM employs a set of the individual distributed feedback (DFB) lasers, with one DFB laser per channel and with the DFB configured to transmit. FIG. 1 illustrates a DWDM 100 having forty individual DFB lasers 102 for transmitting optical signals via a single optic fiber 104. An optical multiplexer 106 couples signals received from the individual DFBs via a set of intermediate optic fibers 107 into output optic fiber 104. Each DFB laser transmits at a different wavelength of the 40-channel ITU C band. This enables forty separate channels of information to be transmitted via the single optical fiber 104 to a de-multiplexer (not shown) provided at the far end of the optical fiber.

To permit the DWDM to transmit forty separate channels simultaneously, each individual DFB must be tuned to a single ITU transmission channel wavelength. A DFB laser can be tuned only within a narrow wavelength band, typically about 2 nm in width. Hence, for the 40-channel protocol of the ITU C band having 0.8 nm transmission line spacing, the typical DFB can only be tuned to one of a few adjacent lines out of the total of 40 lines of the ITU grid. Traditionally each individual DFB laser is manually calibrated at the factory to emit at a corresponding one of the ITU transmission lines. This is achieved by adjusting the laser operating temperature and current to obtain the desired wavelength. The laser is then, in some implementations, locked to the target wavelength by routing the output beam from each DFB laser through a corresponding manually tunable etalon. (The etalons are not shown in FIG. 1.) A manually tunable etalon is an optical device that produces a periodically-varying transmission spectrum as a function of laser wavelength. By tilting the etalon relative to the DFB laser beam path, a transmission peak of the etalon can be made coincident with the target ITU channel. The wavelength of an etalon transmission peak is calibrated to one of the ITU transmission lines by manually adjusting the angle of the etalon while monitoring the wavelength output from the etalon using an optical wavelength analyzer. The angle of the etalon is adjusted until the output wavelength is properly aligned with one of the ITU transmission lines, then the etalon is mounted in place in an attempt to lock the output wavelength of etalon to the selected ITU transmission line. This is a difficult and time-consuming process requiring skilled technicians. Calibration of all forty DFB lasers of a single DWDM can be quite expensive. Mechanical or thermal drift of the etalon over time often moves the transmission peak away from the target ITU channel, which requires recalibration.

Once the DFB lasers of a single DWDM are properly aligned with the ITU grid, the DWDM may then be used for transmitting signals over a fiber optic line, such as for transmitting digital data over computer networks or for transmitting television signals from a television network to one of its affiliates. A single DWDM must be provided for use with each fiber optic line employed for DWDM transmissions and hence a single customer installation, such as a television broadcast center, may require many, many DWDMs. If one of the DFB lasers within a DWDM drifts from its corresponding ITU transmission line or otherwise malfunctions, the entire DWDM typically needs to be replaced to permit the malfunctioning DWDM to be returned to the factory to be re-calibrated or otherwise fixed. As a result, the cost of maintaining a set of DWDMs is often substantial. To help remedy this problem, some DWDMs are provided with an additional widely tunable laser (WTL), which can be tuned separately to any one of the ITU grid lines. Hence, if one of the DFB lasers malfunctions, the single WTL can be tuned to the corresponding transmission wavelength of the DFB to thereby permit the DWDM to continue to operate. Additional WTLs can be supplied with a DWDM to accommodate the failure of two or more DFB channels, and such "sparing" is a major advantage a WTL over a DFB. However, the WTL cannot simply and accurately be tuned to any target ITU channel at a customer installation and must be calibrated at the factory for operation at a specific channel.

Another problem associated with employing DFB lasers within DWDMs is that, because each DFB laser can only be tuned within a narrow range of about 2 nm, each DFB laser can only be calibrated to one of a few adjacent ITU transmission wavelength lines. It is sometimes desirable to configure the DWDM to use many lasers for transmitting at a single ITU transmission line to provide more bandwidth on that channel. When using DFB lasers, no more than two or three of the lasers can be calibrated to a single ITU transmission line. Hence, in some DWDMs, WTLs are used exclusively instead of DFB lasers, thus permitting any of the lasers to be manually calibrated at the customers installation to transmit on any of the ITU transmission lines. Although the use of WTLs remedies many of the problems associated with using DFB lasers, WTLs are difficult and expensive to fabricate and initially calibrate, and are susceptible to wavelength drift requiring frequent recalibration at the customers installation by trained technicians and hence necessitating high overall installation and maintenance costs.

Thus, whether using DFB lasers or WTLs within a DWDM, significant problems arising in achieving and maintaining proper wavelength calibration of the lasers to permit reliable operation of the DWDM. Accordingly, there was a need to provide an efficient method and system for calibrating transmission lasers within a DWDM and it was to that end that the invention of the parent application was primarily directed. Briefly, the parent patent application involved techniques for calibrating a transmission WTL of a DWDM using an etalon and a gas cell having acetylene, hydrogen cyanide or carbon dioxide. Initially, the absolute transmission wavelengths of the WTL are calibrated by routing an output beam from the WTL through the etalon and through the gas cell while varying tuning parameters of the WTL to thereby generate an etalon spectrum and a gas absorption spectrum both as functions of the tuning parameters. The etalon and gas absorption spectra are compared, along with input reference information specifying gas absorption as a function of absolute wavelength, to determine the absolute transmission wavelength for the WTL as a function of the tuning parameters. The WTL is then tuned to align the transmission wavelength of the WTL to an ITU transmission grid line. By tuning the output wavelength of the WTL using an etalon in combination with a gas absorption cell, the WTL can be quickly, easily and precisely set to a selected ITU transmission grid line at a customer installation. The tuning process can be periodically repeated to maintain precise tuning of the WTL despite possible temperature or mechanical drift of the various components. In one implementation, a hand-held wavelength mapper is provided for manually connecting to a WTL to tune the WTL to a selected ITU transmission gridline. In another implementation, the wavelength mapper is permanently attached to the WTL along with a wavelength locker to lock the WTL to an ITU transmission gridline.

Insofar as wavelength locking is concerned, the parent application describes a wavelength locker employing a temperature-controlled etalon. After the aforementioned wavelength mapping steps are performed to determine the absolute wavelength of the laser as a function of the laser tuning parameters, tuning parameters are applied to the laser to tune the laser to a selected transmission wavelength, such as an ITU channel wavelength. A temperature offset is applied to the etalon of the wavelength locker to vary the wavelengths of the transmission peaks of the etalon until one of the transmission peaks is precisely aligned with the selected wavelength. Any drift of the laser from the etalon transmission peak is detected and the tuning parameters applied to the laser are automatically adjusted to compensate for the drift. The temperature of the etalon is precisely maintained so that the etalon transmission peak does not drift from the selected wavelength. In this manner, the main output beam of the laser remains locked on the absolute wavelength of the selected transmission channel despite possible variations in the output characteristics of the laser. Periodically, the system can be recalibrated using the known absolute wavelengths of the gas absorption chamber to ensure that the transmission peak of the etalon has not drifted from the absolute wavelength of the selected transmission channel.

Although the parent application describes highly useful techniques for mapping the transmission wavelengths of lasers within a DWDM and for locking the transmission wavelengths to ITU grid lines, room for further improvement remains, particularly insofar as the design and fabrication of the wavelength locker is concerned. For practical applications, the wavelength locker should be highly miniaturized and configured so as to consume relatively little power. The wavelength locker also should be sufficiently durable to operate reliably over a ten- or twenty-year lifetime. Ideally, the wavelength locker should be designed so as to work in combination with any of a wide variety of ITU transmission protocols and fiber optic transmission rates, both existing and proposed. Perhaps most importantly, the wavelength locker should be designed so as to be sufficiently inexpensive for practical use. Difficulties arise in each of these areas.

Each WTL for use in a DWDM is typically provided in a miniature "butterfly" package for mounting to a circuit board also containing microcontrollers and other components. The circuit boards are mounted in a parallel array within the DWDM with, typically, one board per ITU channel. Hence, a forty ITU channel DWDM employs forty circuit boards; an eighty ITU channel DWDM employs eighty circuit boards. Current state-of-the-art WTLs typically draw about ten watts of power, thus requiring 400 watts of power or more for the a forty channel DWDM and correspondingly more power for 80 or 160 channel DWDMs. A significant portion of the power is consumed by thermoelectric (TE) coolers provided for controlling the temperature of the semiconductor laser of the WTL. With the WTLs already consuming considerable power, it is particularly important that the wavelength locker be configured so as to minimize power consumption, particularly the temperature-controlled etalon. Minimizing power consumption, however, typically requires that the etalon be configured to provide numerous closely-spaced transmission peaks (i.e. to have a narrow free spectral range) such that relatively little heating or cooling is required to expand or contract the etalon or change its index of refraction sufficiently enough to align one of the transmission lines of the etalon with a selected ITU grid line. Using numerous closely spaced peaks, however, increases the risk that the wavelength locker will lock the transmission wavelength of the WTL to the wrong wavelength. Also, to provide numerous closely-spaced transmission peaks, the etalon typically must be configured to have a very short optical axis, thereby making it more difficult to fabricate and align.

Moreover, difficulties arise in adequately insulating the temperature-controlled etalon so as to minimize power loss and to ensure a minimal temperature gradient within the etalon. Any significant temperature gradient within the etalon tends to degrade the finesse of the etalon (i.e. the sharpness of the individual etalon lines) thus making it difficult to achieve precise wavelength locking. Likewise, any slight misalignment of the etalon or any slight imprecision in reflection coatings of the etalon reduces the degree of finesses. Lack of adequate insulation, of course, also increases power consumption and generates a greater amount of waste heat, which may affect the ability of the TE cooler of the laser to efficiently control the temperature of the laser, particularly if the etalon is mounted closely adjacent to the laser within the butterfly package. Typically, manufacturing protocols for DWDMs specify that the DWDM must operate at 70 degrees Celsius or less, thus putting further limitations on the design of the temperature-controlled etalon. It is difficult, therefore, to provide a temperature-controlled etalon and other wavelength locker, which achieves the requisite degree of finesse for precise wavelength locking while also minimizing power consumption, even for use with just one ITU channel protocol. Ideally, however, the temperature-controlled etalon and other components of the wavelength locker should be configured to work with any of a variety of ITU channel protocols, such as 40 to 640 channels, and with any of a variety of transmission frequencies, such as from 2.5 GHz to 100 GHz. Also, ideally, the wavelength locker is sufficiently miniaturized to mount inside the butterfly package of the WTL to minimize overall circuit board space.

For all of the foregoing reasons, it would highly desirable to provide improved methods and systems for implementing a wavelength locker for use in locking the transmission wavelength of a laser of a DWDM, which is highly miniaturized, achieves low implementation costs and operating costs, consumes relatively little power, works in combination with any of a wide variety of ITU transmission protocols, and is sufficiently durable to reliably operate for ten to twenty years. The invention of the present application is directed to providing just such a wavelength locker.

SUMMARY OF THE INVENTION

A system and method is provided for locking a laser to a transmission wavelength using a tunable etalon. In accordance with the system, a laser wavelength detector detects a transmission wavelength of the output beam of the laser. An etalon splits a portion of the output beam of the laser into a series of transmission lines and an etalon wavelength detector detects the etalon transmission lines. A control unit sets the transmission wavelength of the output beam of the laser to a selected wavelength and also tunes the etalon to align a selected one of the etalon transmission lines to the selected wavelength. The control unit thereafter detects any drift of the transmission wavelength of the laser from the selected etalon transmission line and adjusts the laser to compensate for any drift such that the output beam of the laser is locked to the selected transmission wavelength so long as the selected etalon transmission line remains at the selected wavelength.

In an exemplary embodiment, the wavelength locker is mounted to a WTL circuit card for use in a DWDM for transmitting signals via ITU protocols. The etalon of the wavelength locker is a miniature temperature-controlled silicon etalon having an optical axis length of about 5.36 mm and a cross-section of about 3 mm by 3 mm. The etalon is configured to have finesse of about 20 and provide a free spectral range of about 8 GHz. With these parameters, the system can lock the wavelength of the laser to within a precision of about ±0.2 GHz and hence is ideal for use with most ITU transmission protocols, such as C-band protocols from 40 channels up to 2500 channels or more, and for use with most transmission rates, such as rates from 2.5 GHz to 100 GHz. Two resistive heating elements are deposited on opposing sides of the etalon for use in heating the etalon. The control unit varies the wavelengths of the transmission peaks of the etalon by selectively routing current through the heating strips to vary the temperature of the etalon within the range of about 70 to 75 degrees C. to thereby selectively vary the optical length of the etalon by an amount sufficient to vary the wavelengths by up to ½ FSR which in this example is equivalent to 4 GhZ=0.032 nm. Once a transmission line of the etalon has been aligned with the selected ITU line, the temperature of the etalon is precisely maintained so that the etalon transmission peak does not drift from the selected wavelength. Given the small size of the etalon, relatively little power is required to heat the etalon and to vary the transmission peaks of the etalon through the range of wavelengths. Moreover, by operating the etalon in the range of 70 to 75 degrees C., no TE cooling unit is required. Rather, ambient cooling is sufficient to reduce the temperature of the etalon as needed. Hence, significant power savings are achieved over a system requiring a TE cooler or other cooling means for cooling the etalon.

The miniature etalon is sufficiently small to permit mounting within the butterfly package of the laser. Yet the etalon is not so small as to make fabrication and alignment of the etalon difficult, or to require the length of the etalon to be sufficiently short so that the spacing between transmission fringes is too great for efficient use, particularly with ITU protocols having widely-spaced grid lines. As noted above, the wider apart the fringes of the etalon, the more power is required to vary the wavelengths of the fringes sufficiently to permit alignment with a selected ITU transmission channel. If not mounted within the butterfly package, the etalon is preferably enclosed in a separate sealed chamber filled with air, krypton gas or acetylene. By sealing the etalon in either the butterfly package or within a separate chamber, heat losses due to circulating air are eliminated. The etalon is mounted to an interior of the butterfly package or separate chamber using an insulating material having a bonding material including a silicone, epoxy or polyimide binder and a high thermal resistance material in the form of sieved particles such as glass microspheres. The insulating material further reduces heat losses from the etalon so that overall power consumption can be further reduced while also ensuring a substantially uniform temperature throughout the etalon, so that the finesse and FSR of the etalon is not degraded. The reduction of heat loss from the etalon not only permits lower operating power but also helps prevent changes in ambient temperature in the vicinity of the etalon, which might otherwise affect the operation of other components, such as the efficiency of a TE cooler mounted to the laser.

Also in the exemplary embodiment, the system includes wavelength-mapping components for initially calibrating the transmission wavelengths of the laser and the etalon. The wavelength-mapping components include a gas absorption chamber, an optical element for routing a portion of the output beam from the laser through the gas absorption chamber to generate gas absorption spectrum, and a detector for detecting the gas absorption transmission spectrum. A wavelength-mapping control unit is provided for tuning the laser through a range of tuning parameters while the output beam from the laser is routed through the etalon and through the gas cell to produce an etalon transmission spectrum as a function of the laser tuning parameters and to produce a gas absorption spectrum as a function of the laser tuning parameters. An absolute transmission wavelength determination unit is provided for comparing the detected etalon transmission spectrum with the detected gas absorption spectrum to determine the absolute transmission wavelength of the laser as a function of the laser tuning parameters. In one specific embodiment, the miniature etalon is mounted within a gas absorption cell containing acetylene, thus eliminating the need for a separate chamber for the etalon.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein.

DETAILED DESCRIPTION OF THE EXEMPLARY EMBODIMENTS

With reference to the remaining figures, exemplary embodiments of the invention will now be described.

Figure 1:
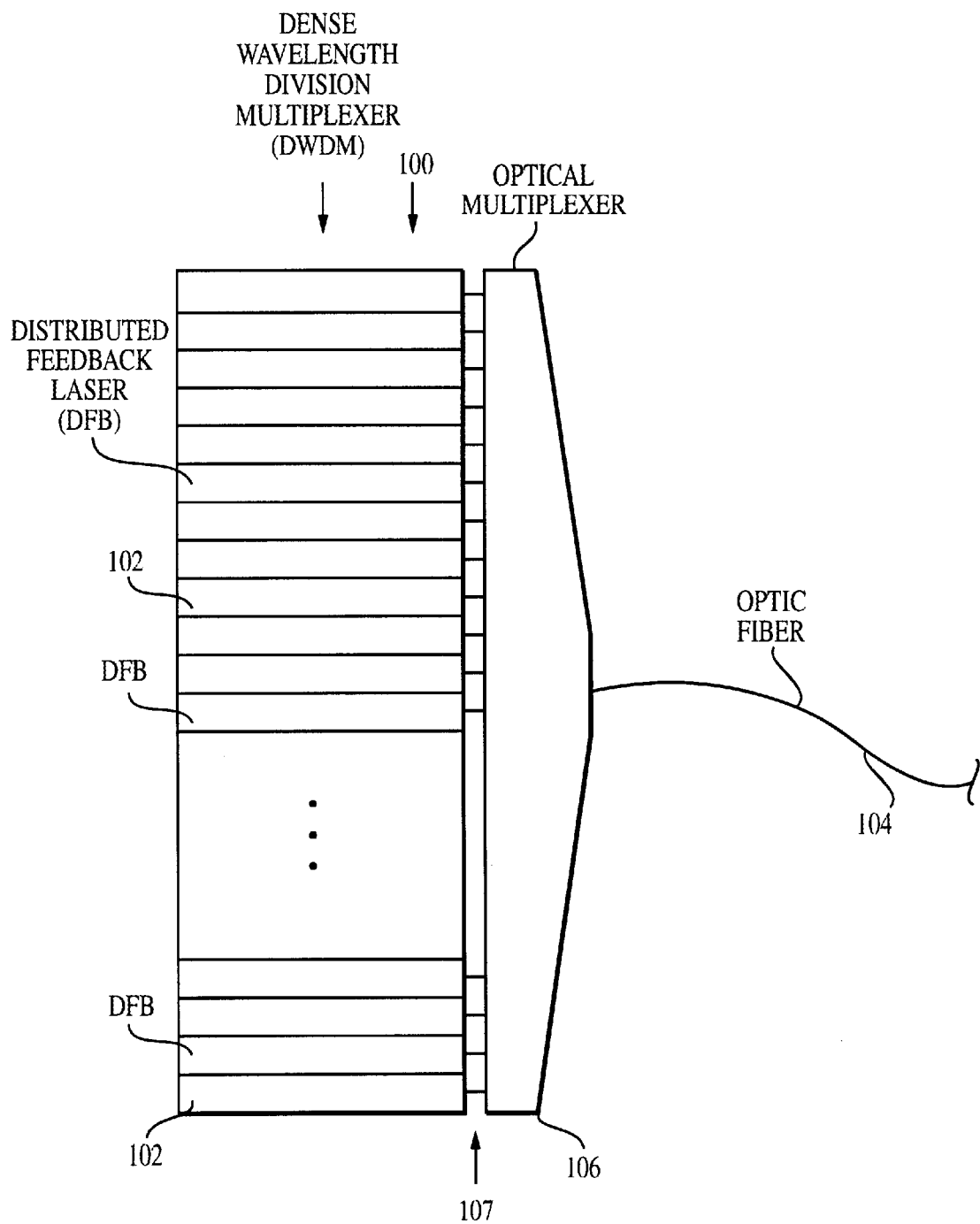
FIG. 1 illustrates a DWDM configured in accordance with the prior art.
Figure 2:
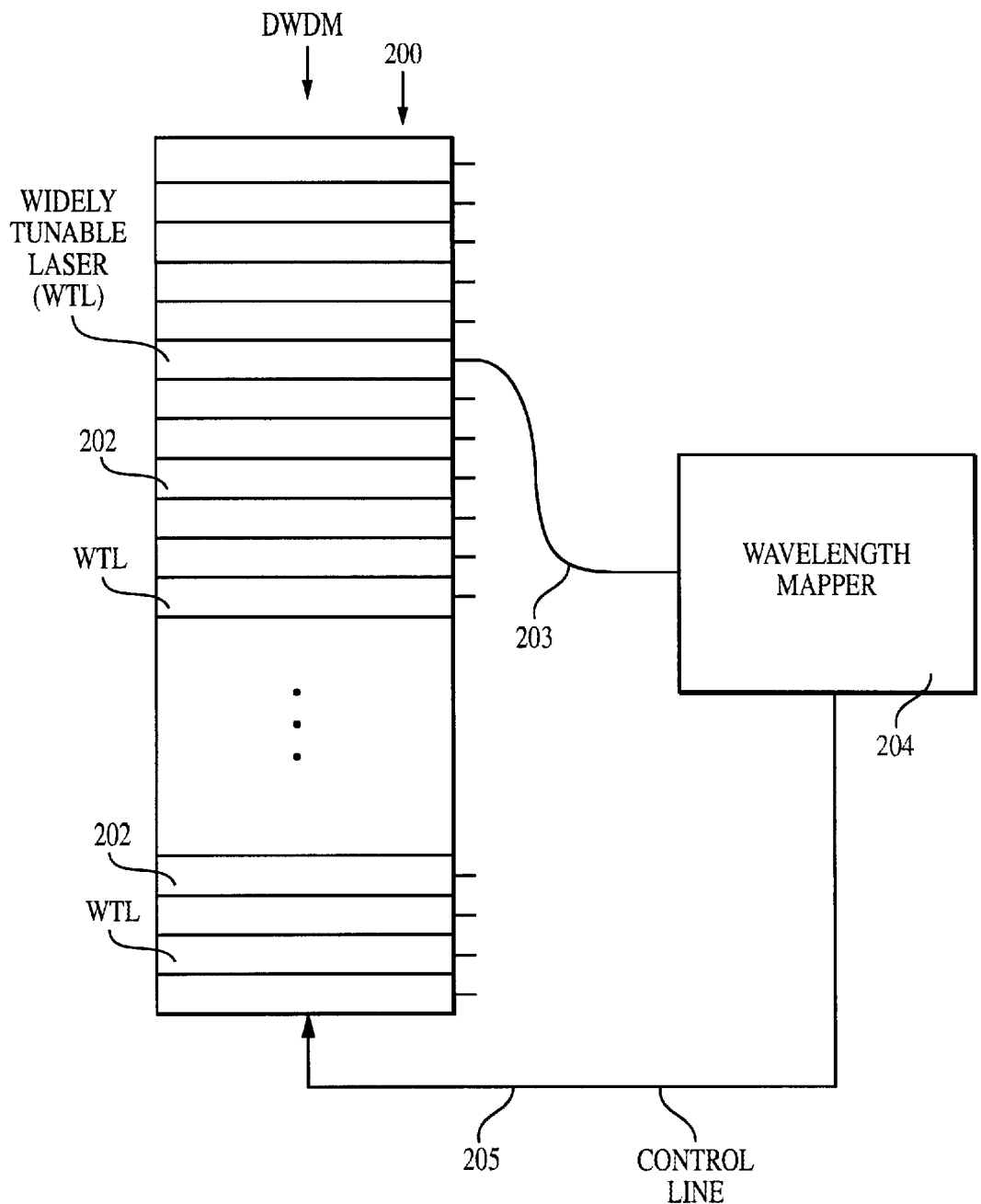
FIG. 2 illustrates a DWDM along with a handheld, portable wavelength mapper provided in accordance with a first exemplary embodiment of the invention, with the wavelength mapper provided for automatically determining the transmission wavelengths of the lasers of the DWDM as a function of tuning parameters of the lasers.

FIG. 2 illustrates a DWDM 200 having forty individual WTLs 202 for transmitting optical signals on forty ITU C-band channels via a single optic fiber (not shown). In FIG. 2, an optic fiber output from a selected WTL is connected via a fiber optic line 203 to the input of a hand-held, portable wavelength mapper 204 configured for automatically determining the transmission wavelength of the WTL as a function of WTL tuning parameters, such as a WTL control voltage or current, output from the wavelength mapper to the selected WTL of DWDM via a control line 205. Although a forty channel DWDM is shown, in other implementations 80, 160, or more WTLs are provided. Also, other lasers may be employed in the alternative, such as DFB lasers, provided their tuning range is sufficient to record a minimum number of gas absorption lines ($\geq 5$).

To permit the DWDM to transmit the forty separate ITU channels simultaneously, each individual WTL of the DWDM must be precisely tuned to a single ITU transmission channel wavelength. For an example wherein the WTLs are tuned by applying a control voltage to the WTL, a separate voltage level is associated with each ITU wavelength. The wavelength mapper operates to determine the resulting transmission wavelength for each WTL for values of the control voltage throughout an entire voltage tuning range. This process is performed sequentially for each of the forty WTLs to generate a separate wavelength vs. voltage map for each WTL. Thereafter, any particular WTL can be tuned to any selected transmission wavelength merely by accessing the corresponding wavelength vs. voltage map to determine the appropriate control voltage. Typically, the WTLs are set to selected ITU C-band, S-band, or L-band channels, but can be set to any selected wavelength. Wavelength mapping is performed when a new WTL laser is fabricated and its tuning parameters must be determined, and when an installed WTL must be accurately tuned to another ITU channel in the field by field service personnel.

Figure 3:
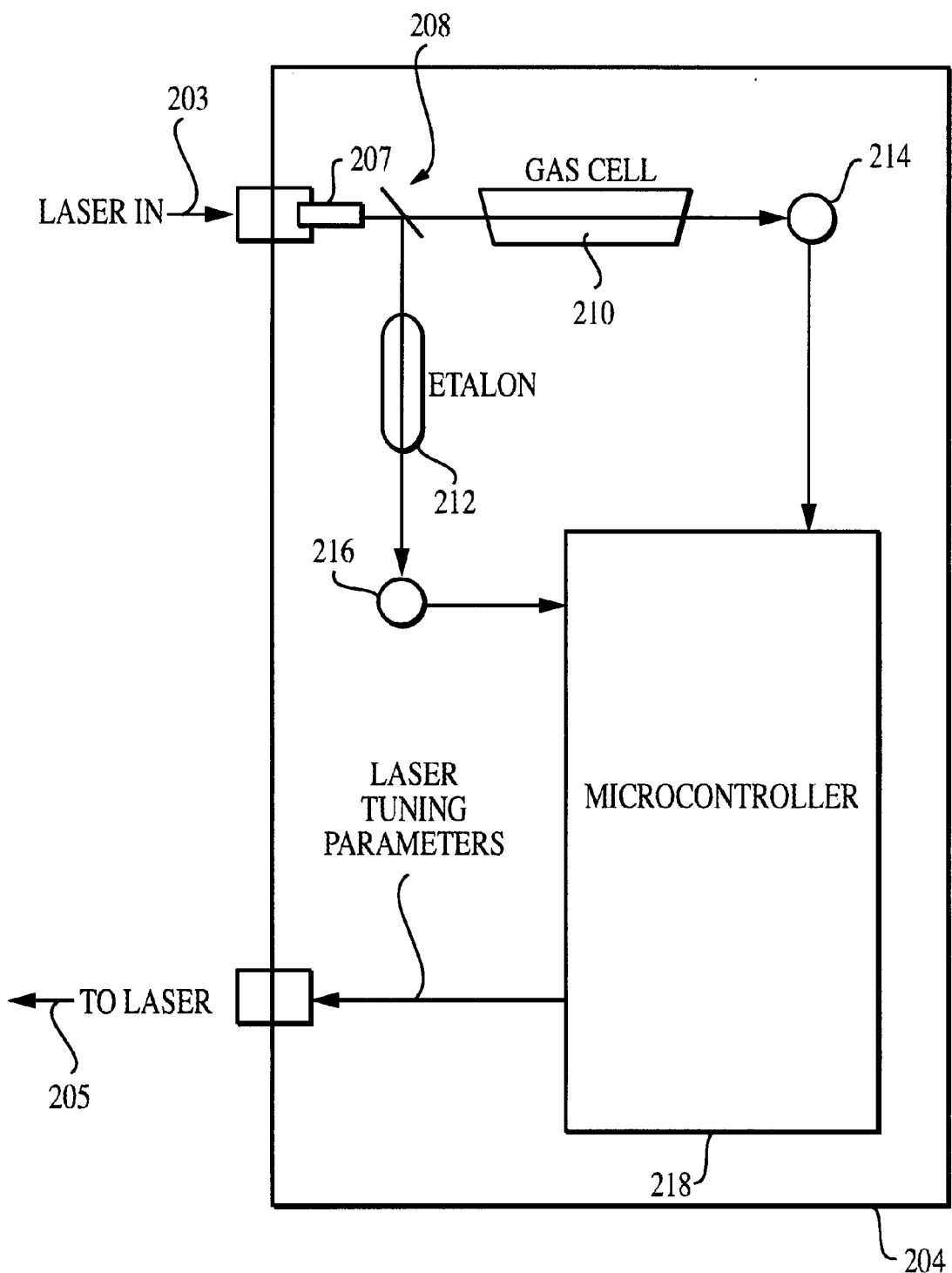
FIG. 3 illustrates the wavelength mapper of FIG. 2.

FIG. 3 illustrates pertinent internal components of wavelength mapper 204. The wavelength mapper receives an input optical beam from one of the WTLs of the DWDM (FIG. 2) via optic fiber 20. The input beam is collimated using a collimator 207 then split using a splitter 208, with one portion of the beam being routed through a gas cell 210 and another portion being routed through an etalon 212. The gas cell contains gas having a known absorption spectrum with numerous absorption lines in the optical bandwidth in which the laser is to be tuned. For a laser to be tuned within the ITU C- and S-bands, acetylene is appropriate ($H^{13}CN$ Is also appropriate for C-bands), with carbon dioxide being suitable for the L-band. The etalon is configured to provide numerous transmission maxima within the optical bandwidth in which the laser is to be tuned. The etalon, as with all etalons, provides transmission lines (or fringe peaks) equally spaced in terms of wavenumbers. (A wavenumber is 10,000/(wavelength in microns) and thereby can easily be converted to wavelength or frequency). For use with a forty channel ITU C-band DWDM, the etalon is preferably configured to provide at least five hundred transmission peaks in the C-band.

A first optical detector 214 detects a beam emergent from the gas cell and a second optical detector 216 detects a beam emergent from the etalon. Signals detected by the detectors are routed into a microcontroller 218 for processing therein. The microcontroller is also connected to the DWDM via control line 205 to control the selected WTL of the DWDM to scan through the entire ITU C-band. In other words, the microcontroller varies the voltage or current input to the WTL throughout an entire input range to thereby vary the transmission wavelength of the WTL throughout the entire ITU C-band. As a result, the two optical detectors both receive an entire spectrum of optical signals covering the entire ITU C-band. The detector coupled to the etalon detects an etalon spectrum having etalon transmission lines therein. The detector coupled to the gas cell detects a gas absorption spectrum having gas absorption lines therein. The microcontroller also inputs a reference gas absorption spectrum for the gas contained within the gas cell wherein the reference absorption spectrum specifies the absolute wavenumber, wavelength or frequency for each of the absorption lines of the gas. The microcontroller processes the detected etalon and gas absorption spectra in combination with the reference gas spectrum to determine the transmission wavelengths of the WTL as a function of the voltage or current tuning parameter applied to the WTL to thereby map the wavelengths of the WTL. The wavelength map is stored for subsequent use in setting the WTL to transmit at any selected wavelength, such as at one of the ITU C-band channels.

Figure 5:
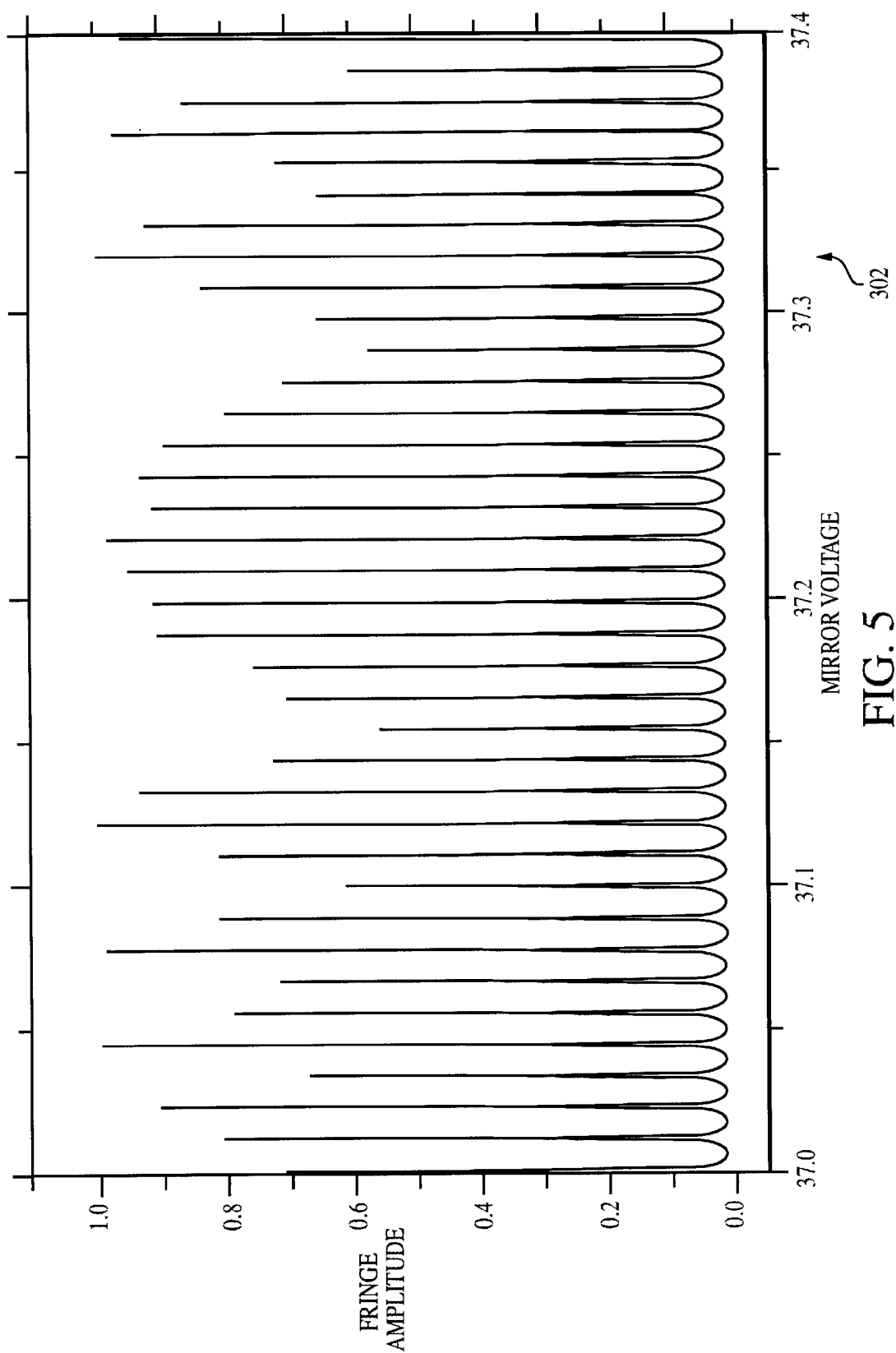
FIG. 5 illustrates an exemplary etalon transmission spectrum detected by the method of FIG. 4, scaled as a function of a laser voltage tuning parameter.
Figure 6:
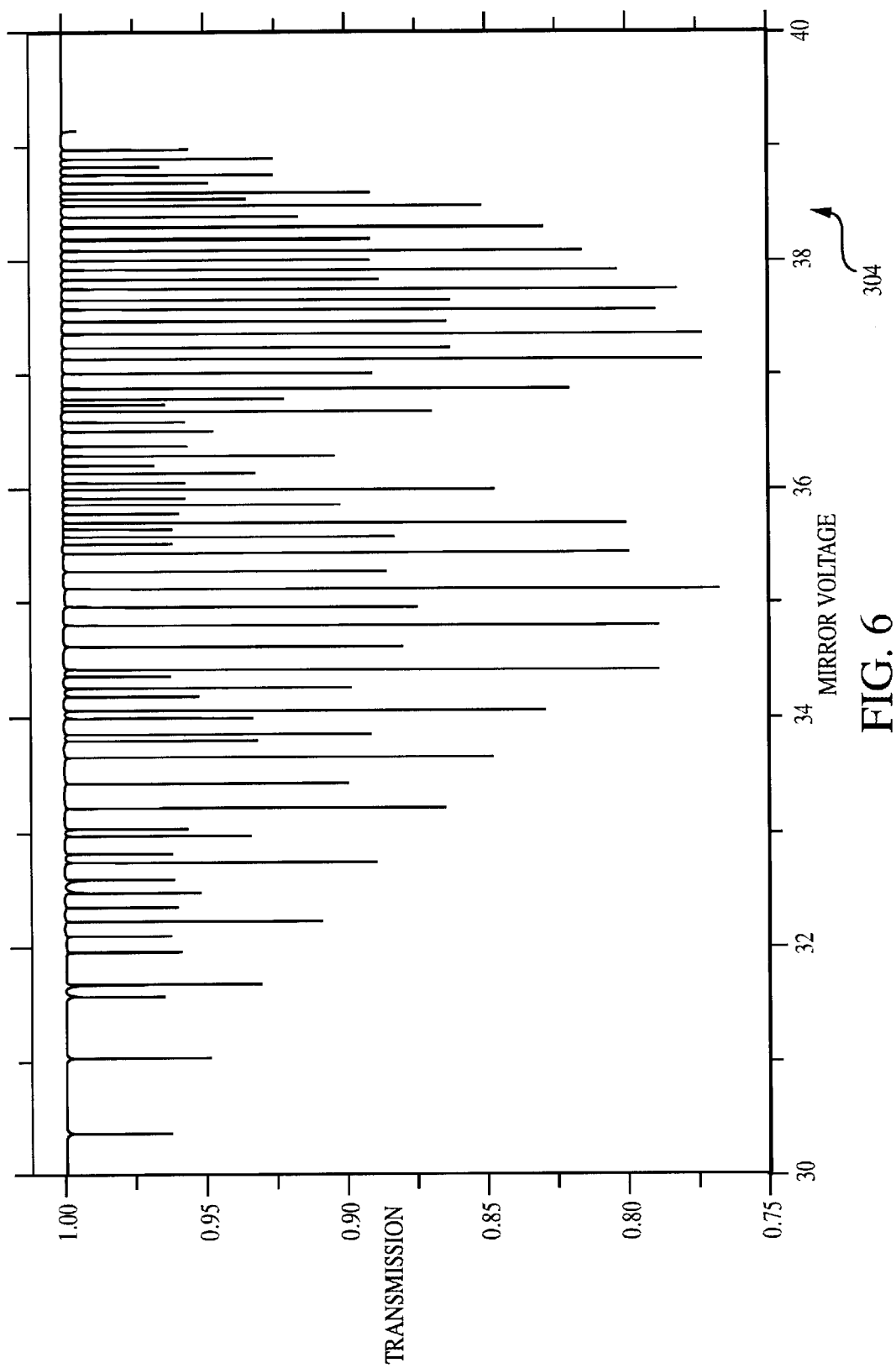
FIG. 6 illustrates an exemplary gas absorption spectrum detected by the method of FIG. 4, also scaled as a function of the laser voltage tuning parameter.

The manner by which the wavelength mapper generates a wavelength vs. tuning parameter map for a WTL or other laser will now be described in greater detail with reference to FIGS. 4-7. Initially, at step 300 of FIG. 4, the wavelength mapper routes an output beam of the laser through the etalon and through the gas call while tuning the laser through a complete range of tuning parameters to generate an etalon transmission spectrum and gas absorption spectrum. In one specific example, for a laser tuned by a control voltage ranging from 0.0 to 40.0 volts, the wavelength mapper incrementally increases the voltage from 0.0 to 40.0 volts by voltage increments of 0.0000610352 volts to generate etalon and gas absorption spectra each with 65536 data points. The etalon and gas absorption spectra are detected at step 306 and stored in separate data arrays by the wavelength mapper. A section of an exemplary etalon spectrum 302 for an etalon having a peak spacing of about 6.6 gigahertz (GHz) is shown in FIG. 5. Preferably, however, an etalon with a peak spacing of about 8 GHz is used. A section of an exemplary gas absorption spectrum 304 for acetylene is shown in FIG. 6. Both spectra are scaled by voltage. For each data point, the wavelength mapper also stores the corresponding data point number in a data array. Hence, the detected etalon and gas absorption spectra are both recorded as functions of voltage, not wavelength or frequency, which is as yet unknown.

Figure 4:
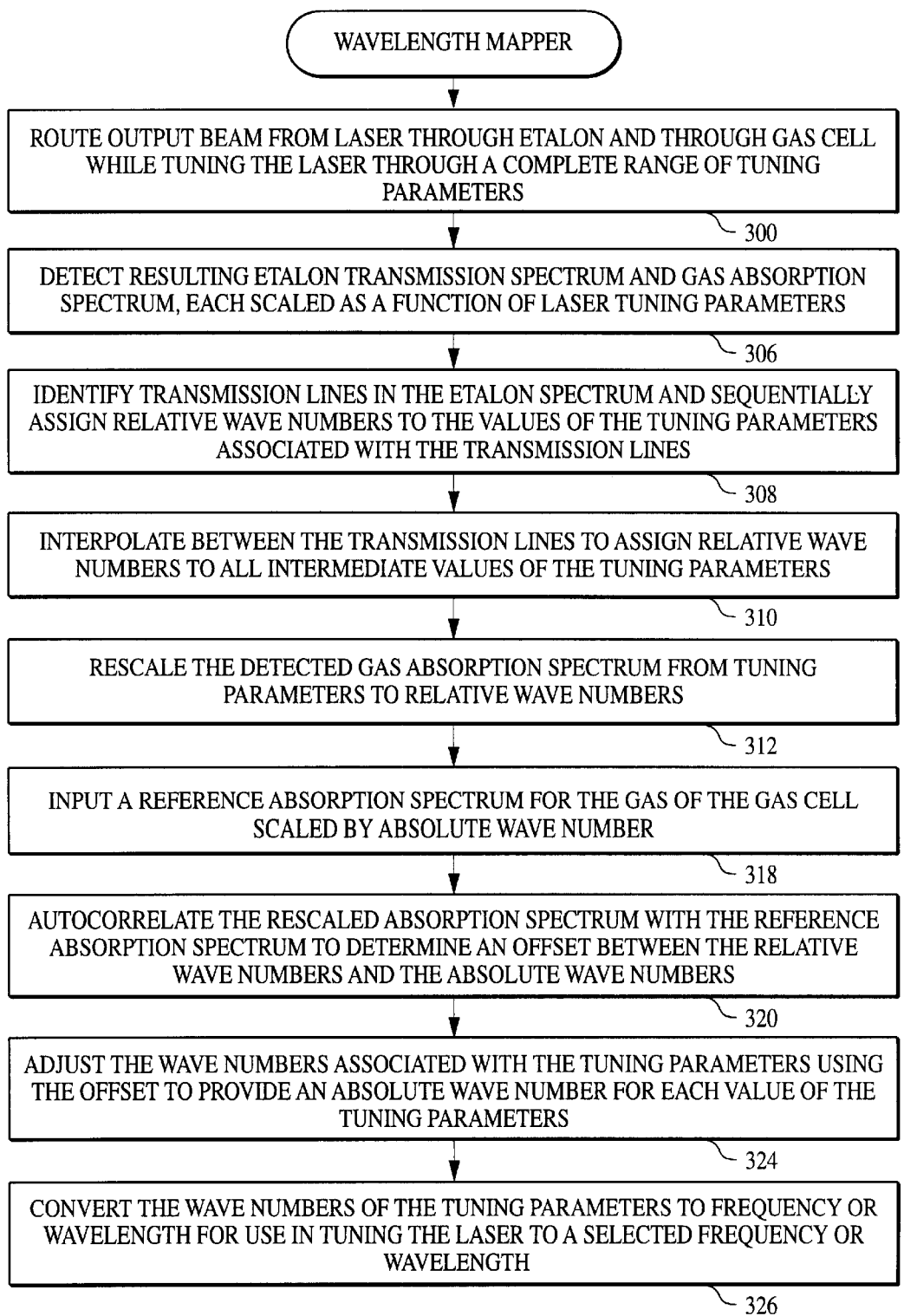
FIG. 4 illustrates a method performed by the wavelength mapper of FIG. 3.

Continuing with FIG. 4, the wavelength mapper then processes the detected etalon spectrum at step 308 to identify and locate transmission peaks therein. The peaks are located by determining first and second derivatives of the etalon spectrum as a function of data point and by applying polynomial fitting in the local peak areas in accordance with conventional techniques. The location of each peak is specified by its corresponding fractional data point number. Note that the peaks are not equally spaced in terms of the data points. Rather, the peaks are generally non-linearly distributed among the data points. In any case, once the peaks are identified and located, the wavelength mapper sequentially assigns relative wavenumbers to each of the transmission peaks beginning with 1 and proceeding to the last detected peak. In the example of FIG. 5 (which shows only a very small section of the etalon spectrum), there are 37 peaks and hence the peaks may be numbered from e.g. 400 to 437. The relative wavenumbers generated by this process are stored in the etalon spectrum data array at the fractional data point corresponding to the voltage peak, and interpolated to the integer point numbers surrounding the peak. For example, if the 403rd transmission peak is found at data point 50788.56 out of the 65536 data points, then relative wavenumber 403 is assigned to fractional data point 50788.56. Relative wavenumbers for integer data points 50788 and 50789 are obtained by interpolation and stored in the etalon data array. Similarly, if the 404th transmission peak is found at data point 50823.17 out of the 65536 data points, then relative wavenumbers 404 is stored in association with fractional data point 50823.17. Fractional relative wavenumbers for the adjacent integer points 50823 and 50824 are assigned by interpolation. The relative wavenumbers can be assigned to the transmission peaks of the etalon spectrum sequentially because the peaks are generated by an optical etalon which, by virtue of its optical properties, produces peaks substantially equally spaced in wavenumber. Hence, even though the peaks are not equally spaced as a function of the data points or as a function of laser input voltage, the peaks are nevertheless equally spaced as a function of relative wavenumber, and sequential wavenumbers can be reliably assigned. The wavenumbers are referred to herein as relative wavenumbers because the absolute wavenumber (and hence the absolute wavelength or wavelength) is not yet known.

Thus, upon completion of step 308, relative wavenumbers have been assigned only to those integer data points in the etalon spectrum array that correspond to the closest etalon transmission peak. At step 310, the wavelength mapper interpolates between the peaks to assign fractional wavenumbers to each intermediate data point. For the example wherein the relative wavenumber 403 falls between data points 50788 and 50789, and relative wavenumber 404 falls between integer data points 50823 and 50824, the wavelength mapper interpolates between the assigned fractional wavenumbers to data points 50789 through 50822. In one specific example, as a result of the interpolation, data point 50789 may be assigned a relative wavenumber of 6471.5600; data point 50790 may be assigned a relative wavenumber of 6471.5625; and so on. In this manner, interpolation is preformed to assign fractional relative wavenumbers to each remaining value in the etalon spectrum data array. Note that the fractional wavenumbers are not necessarily evenly distributed between integer wavenumbers. Rather, as a result of the interpolation, the fractional wavenumbers may be assigned non-linearly. Thus following interpolation, each integer data point of the etalon array has a relative wavenumber associated therewith. The relative wavenumbers are stored along with the corresponding voltage values in the etalon spectrum data array to thereby provide a relative wavenumber for each data point.

At step 312, the relative wavenumbers generated for each data point of the etalon array are used to re-scale the gas spectrum data array. To this end, the relative wavenumber of each data point of the etalon spectrum array is assigned to the corresponding data point of the detected gas absorption spectrum array. At this point a relative wavenumber scale exists both for the etalon transmission spectrum and the gas absorption spectrum. However, the relative wavenumber scale is not linear because of the non-linear tuning properties of the laser.

Figure 7:
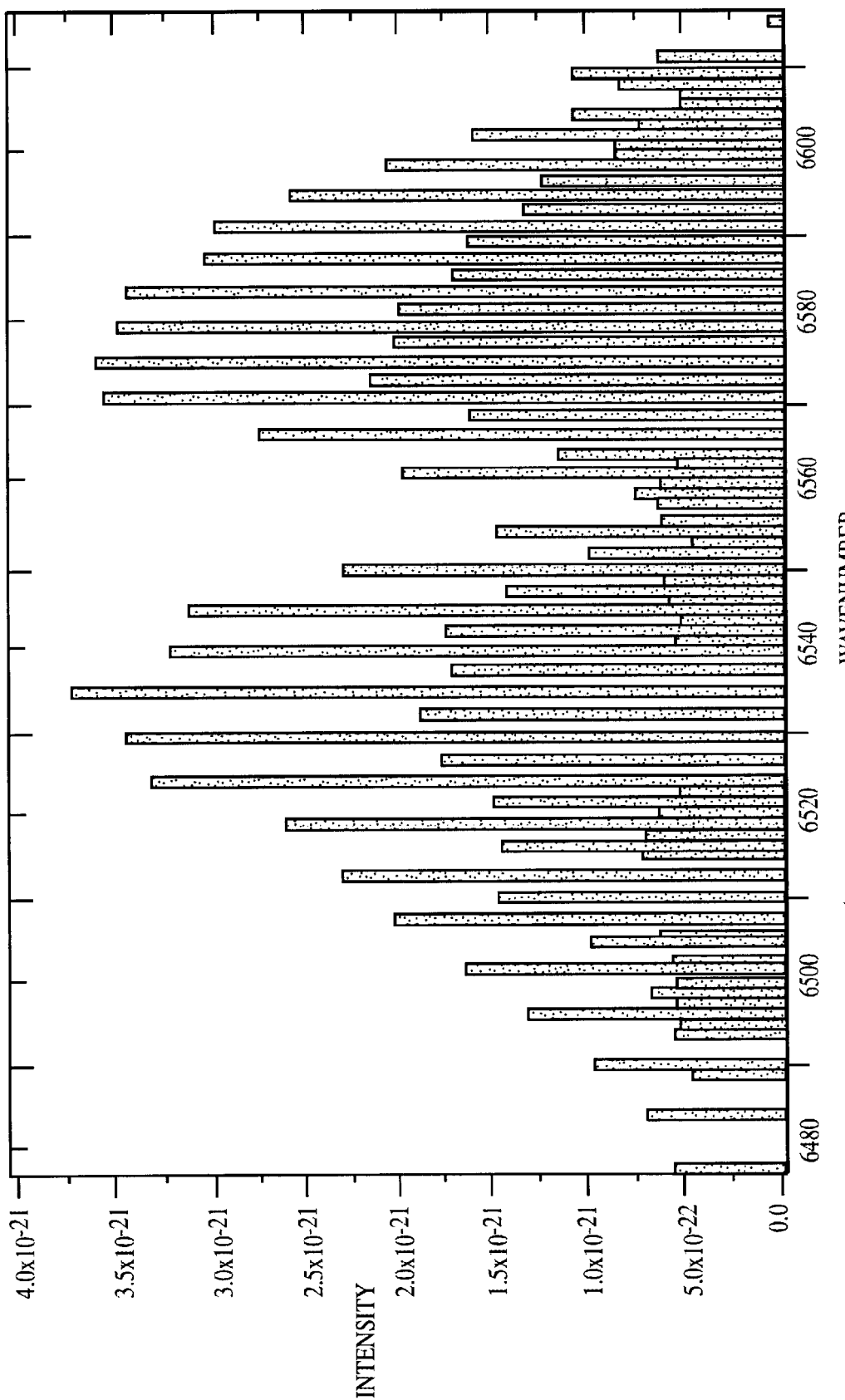
FIG. 7 illustrates an input reference gas absorption spectrum.

At step 318, the wavelength mapper inputs a reference gas absorption intensity spectrum for the gas of the gas cell, wherein the reference spectrum is scaled according to absolute wavenumber, rather than relative wavenumber. FIG. 7 illustrates a portion of an exemplary reference gas intensity spectrum 322 for acetylene. This spectrum is generated synthetically using the know frequencies and intensities of the reference gas, which are known to high accuracy through published laboratory measurements and verification by the National Institute of Standards and Technology (NIST). The reference spectrum is input as a data array of equal size to the modified gas absorption data array, e.g. 65536 data points. At step 320, the wavelength mapper autocorrelates the intensity pattern of the modified detected gas absorption spectrum, which is a function of relative wavenumber, with the intensity pattern of the input reference spectrum, which is a function of absolute wavenumber, to determine any offset therebetween. An appropriate autocorrelation technique, modified as needed, may be found in "Correlation-based Technique for Automated Tunable Diode Laser Scan Stabilization", Randy May, *Rev. Sci. Instrum.* 63 (5), May 1992. As a second iteration of the process, the etalon transmission peak spacing (the etalon "free spectral range", or FSR) is more precisely determined from the known gas spectrum line positions, and the wavenumber mapping process is repeated to improve accuracy.

Thus, following step 318, the wavelength mapper stores the modified detected gas intensity spectrum generated at step 312 and the reference gas intensity spectrum input at step 318. The two spectra are similar but are offset from one another. At step 320, autocorrelation is performed to determine the shift of the spectra with respect to one another until the spectra are aligned, thus permitting the amount of shift or offset to be determined. The offset represents the offset between the relative wavenumbers and their corresponding absolute wavenumbers. At step 324, the relative wavenumbers of the various arrays are adjusted using the offset to convert the relative wavenumbers to absolute wavenumbers. Once the absolute wavenumbers are known, an absolute wavelength or frequency is assigned at step 326 to each of the control voltage values stored in the etalon spectrum array.

Although the wavelength mapper has been described with respect to an exemplary embodiment wherein the laser is controlled by a single voltage control signal, in general, any laser can be used with the invention so long as an appropriate gas absorption reference is available and the laser is tunable via a set of input tuning parameters, such as various combinations of input analog or digital signals. The laser is simply scanned through its full range of tuning parameters to enable determination of the absolute output wavelength of the laser as a function of any combination of the tuning parameters. The resulting wavelength vs. tuning parameters map is therefore a multi-dimensional map having a unique wavelength for each combination of tuning parameters. For some lasers tunable with two parameters, it may be sufficient to set a first tuning parameter to a single constant value while varying a second tuning parameter, then set the second tuning parameter to a single constant value while varying the first tuning parameter. In other cases, it may be necessary to tune the laser through every possible combination of the two parameters to account for non-linear effects. For any given laser, routine experimentation can be performed to determine the specific manner with which the tuning parameters are to be varied.

What has been described thus far is a wavelength mapper that operates to generate a map of wavelength vs. tuning parameters for a laser, particularly one in a DWDM. In the following, a wavelength locker is described which automatically sets the laser to a selected wavelength by using a wavelength map, and then locks the laser wavelength using an etalon transmission peak that has been temperature or voltage tuned to the selected ITU channel. As many of the features of the wavelength locker are the same as the wavelength mapper described above, only pertinent differences will be described in detail.

Figure 8:
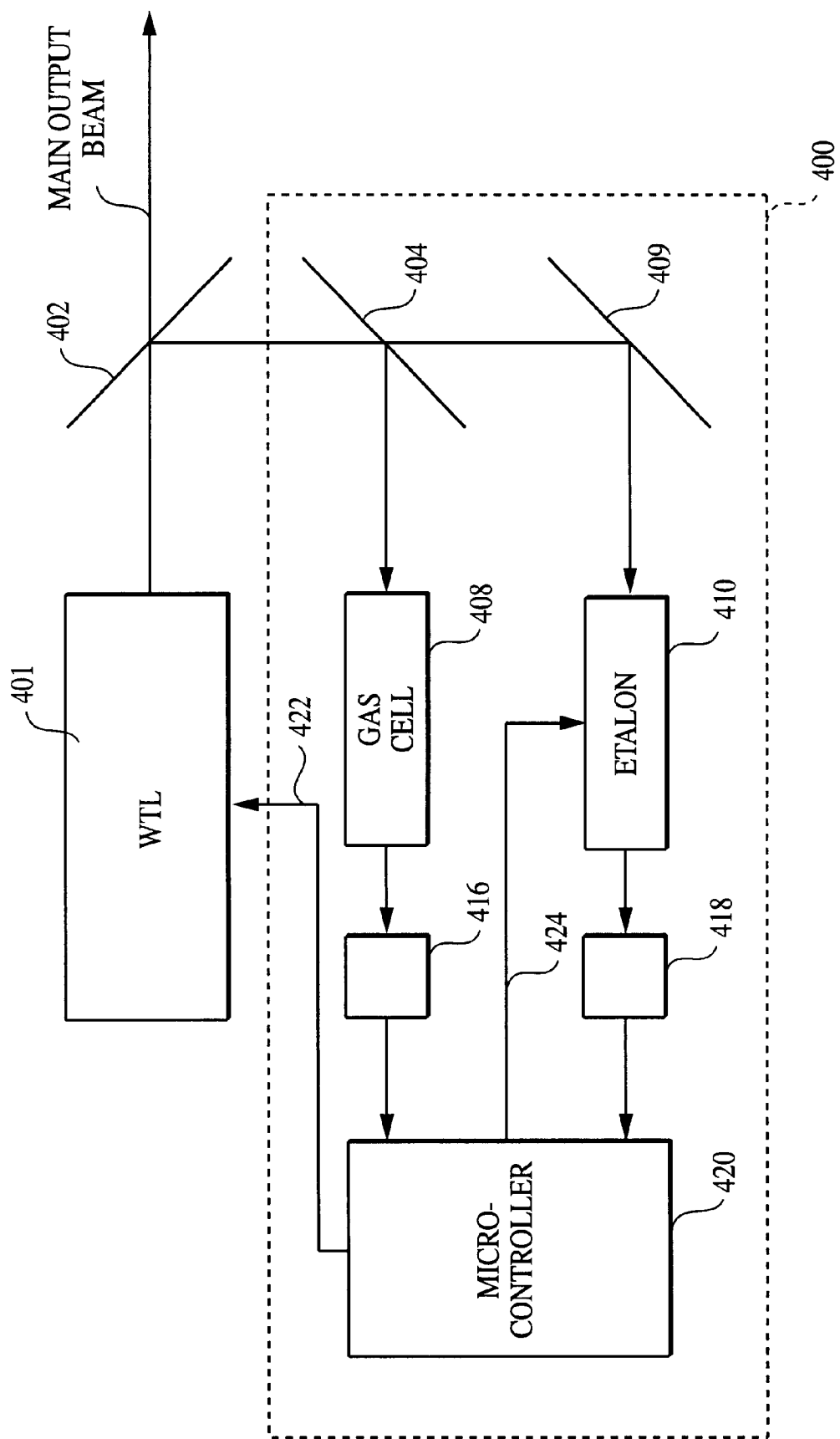
FIG. 8 illustrates an individual DWDM laser along with a wavelength locker provided in accordance with a second exemplary embodiment of the invention, with the wavelength locker provided for automatically locking the wavelength of the laser to a selected ITU transmission wavelength by using a temperature-controlled etalon in a feedback loop.

FIG. 8 illustrates pertinent internal components of a first example of a wavelength locker 400 for use with a WTL 401. The wavelength locker receives the output from WTL 401 via an optical fiber splitter 402. The laser beam input to the wavelength locker is initially of unknown wavelength. Inside the wavelength locker, a second splitter 404 splits the beam in two with one portion routed through a gas cell 408 and the other portion reflected from a mirror 409 and then routed through an etalon 410. Separate detectors 416 and 418 record the transmission spectra of the gas cell and the etalon as with the wavelength mapper. A microcontroller 420 varies control parameters input to the WTL along a control line 422 to generate a spectrum having both etalon transmission peaks and gas absorption lines. The recorded spectra are fed into the microcontroller for processing to generate a wavelength vs. WTL tuning parameter map using the techniques described above. Once the wavelength vs. WTL tuning parameter map has been generated, the microcontroller controls looks up the WTL tuning parameter corresponding to a selected wavelength, such as an ITU channel wavelength, then applies the WTL tuning parameter along control signal along line 422 to tune the WTL to the selected transmission wavelength. Additionally, the microcontroller adjusts a temperature control set point to the etalon via a control line 424 to vary the wavelengths of the transmission peaks of the etalon until one of the transmission peaks, as detected by detector 416, is precisely aligned with the selected output wavelength. The microcontroller then locks the output wavelength of the WTL to the selected wavelength by monitoring the etalon transmission peak that is aligned with the selected wavelength. To this end, the micro-controller detects any drift of the laser output wavelength as detected by detector 418 and adjusts the tuning parameters applied to the WTL via control line 422 to compensate for the drift. In other words, a negative feedback loop is provided which keeps the main output beam locked on a selected transmission channel despite possible variations in the output characteristics of the WTL.

Alternatively, gas cell 408 and etalon 410 are provided along a common optical path and a single detector is provided to detect the etalon and the gas absorption spectra simultaneously. Although the resulting spectra has both etalon peaks and gas absorption lines, the etalon peaks and the gas absorption lines do not significantly interfere with one another and hence the wavelength mapping process performed above can be performed. In this regard, the etalon peaks represent about 30% changes in transmission, whereas the gas lines represent only about 1% using second harmonic detection. Thus, the gas lines represent a very small perturbation to the etalon spectrum and do not interfere with the etalon wavenumber locking procedure, but are strong enough to permit the autocorrelation procedure without significant errors.

Figure 9:
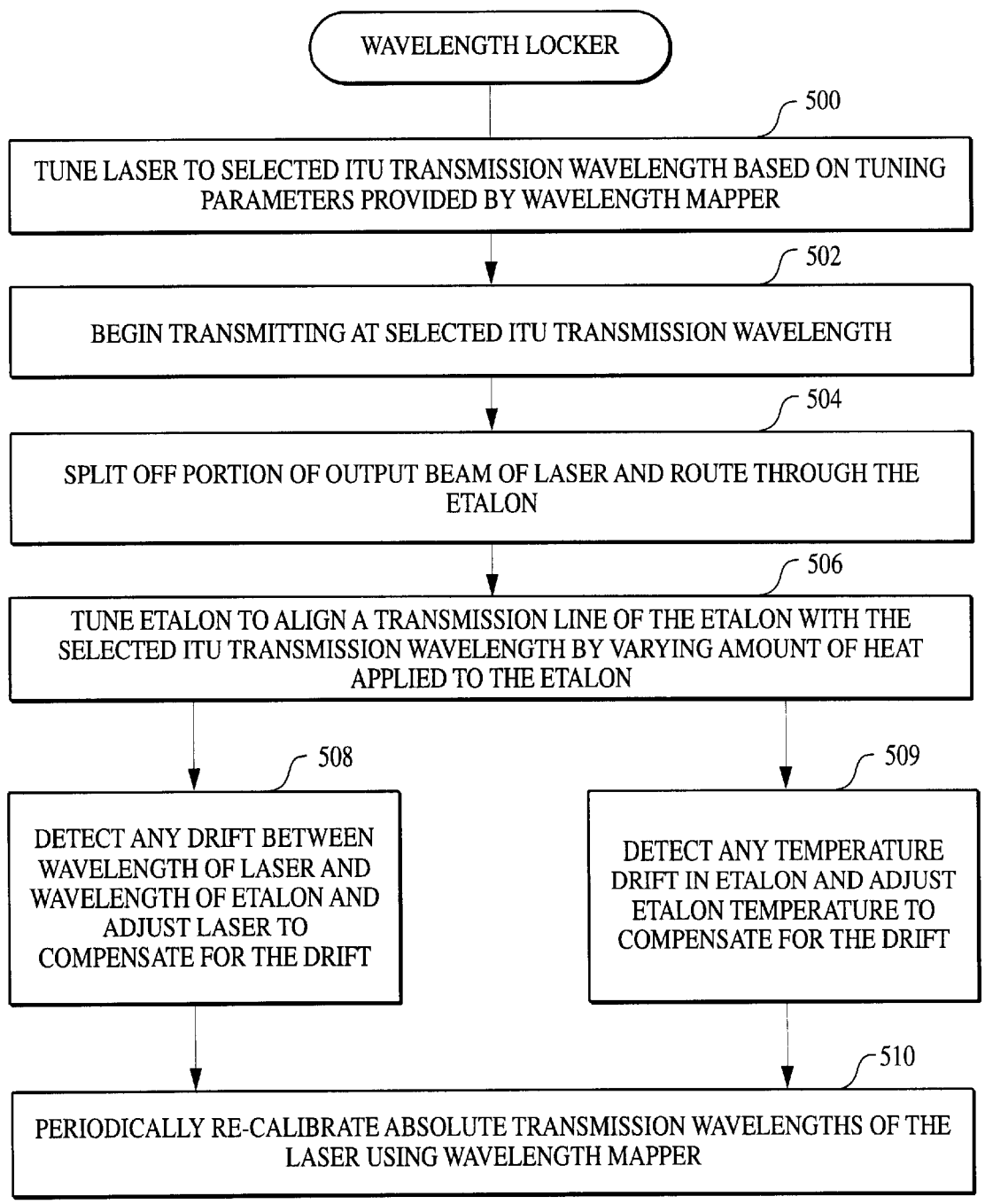
FIG. 9 illustrates a general method for locking the transmission wavelength of a WTL of a DWDM to fixed wavelength using a wavelength locker such as the device of FIG. 8.
Figure 10:
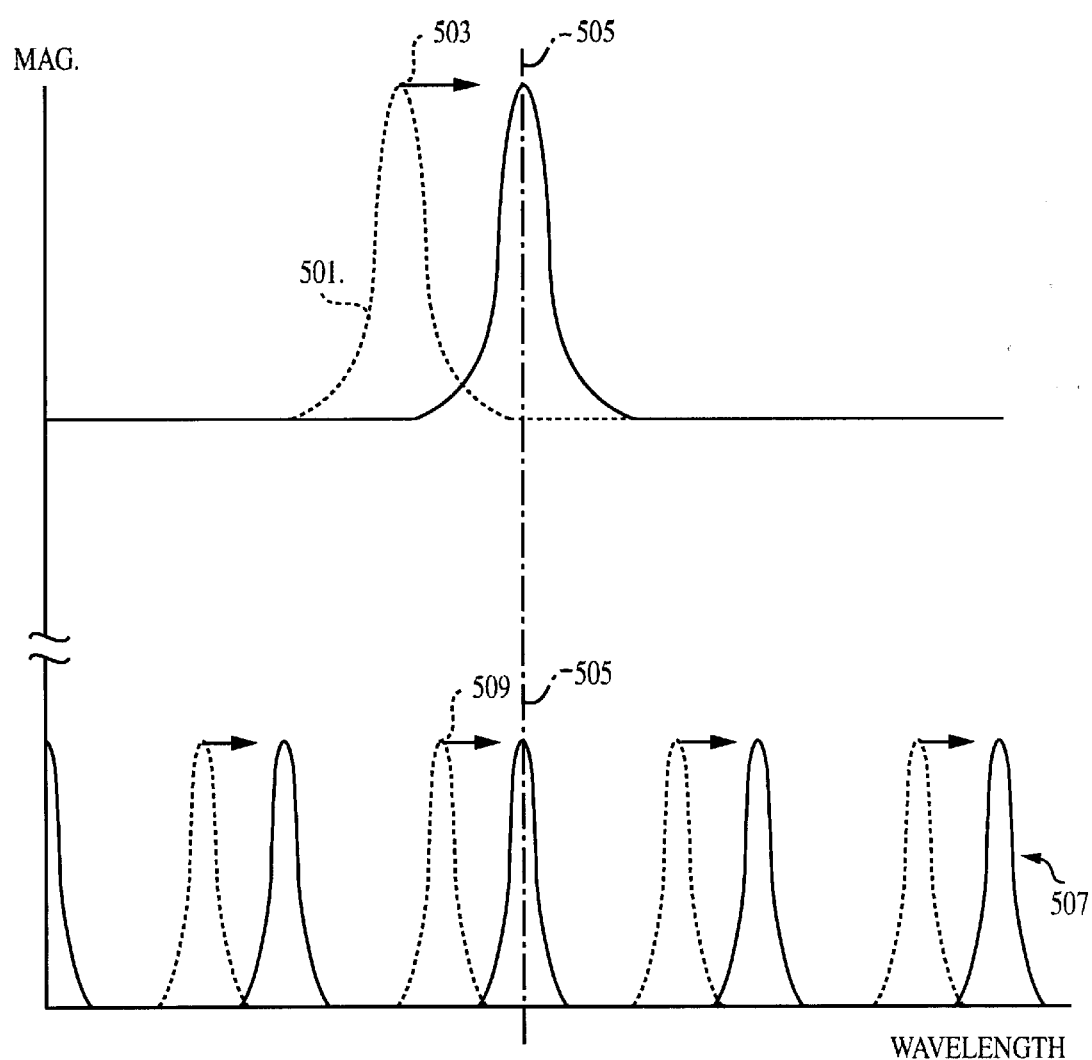
FIG. 10 graphically illustrates a laser transmission beam and a set of etalon transmission lines adjusted using the method of FIG. 8.

The general wavelength locking method of the invention is summarized in FIG. 9. The general method may be performed by the wavelength locker of FIG. 8, by the wavelength lockers of FIGS. 11-17 to be described below, or by any other suitable device. Initially, at step 500 of FIG. 9, a laser (such as a WTL 401 of FIG. 8) is tuned to a selected transmission wavelength. For a WTL of a DWDM, the laser may be set, for example, to the absolute wavelength of one of the channels of the 40-channel ITU C-band transmission protocol. Step 502 is illustrated by FIG. 10, which shows a laser beam 501 being adjusted to move its center wavelength from some initial transmission wavelength 503 to the selected ITU channel wavelength 505. Preferably, tuning is achieved by first performing the wavelength mapping technique described above to map the absolute transmission wavelengths of the laser as a function of tuning parameters to thereby determine the appropriate tuning parameters to apply to the laser to set the laser to the absolute wavelength of the selected transmission channel. But any other suitable tuning technique can be used instead to tune the laser to a selected transmission wavelength. At step 502 of FIG. 9, the laser begins transmitting information signals along an output optic fiber at the selected transmission wavelength. The information signals may include, for example, data, audio or video signals. A portion of the output beam of the laser is split off at step 504 and routed through an etalon (such as etalon 510 of FIG. 8), which splits the beam into a set of interference lines or fringes. At step 506, a microcontroller connected to the etalon adjusts the etalon to align one of the transmission lines with the transmission wavelength of the laser. Step 506 is illustrated in FIG. 10, which shows a set of etalon transmission lines or fringes 507 being adjusted until the center wavelength 509 of one of the etalon transmission lines is aligned with the wavelength of the laser at the selected ITU channel wavelength 505. To this end, the portion of the beam split off from the main output beam of the laser can be split again, as shown in FIG. 8, into two separate beams, one passing through the etalon to a first detector and the other passing to a second detector, either directly or through a gas absorption chamber. The microcontroller receives signals from both detectors and adjusts the temperature of the etalon until a transmission peak of the etalon is obtained with the desired ITU channel (wavelength). This technique suffices to place the etalon transmission line at the absolute wavelength of the selected ITU transmission channel since the laser has already been set, at step 500, to transmit at the selected absolute wavelength and insufficient time has elapsed for the wavelength of the laser to drift from that absolute wavelength.

Hence, following step 506, both the laser and the etalon have been adjusted to emit beams at the ITU channel wavelength and therefore both the first and second detectors receive signals at the same wavelength. At step 508, any wavelength drift between the beams detected by the first and second detectors is identified and the laser is automatically adjusted by the microcontroller to compensate for the drift. To this end, the tuning parameters applied to the laser are adjusted as needed to lengthen or shorten the transmission wavelength of the laser to keep the transmission wavelength of the laser, as detected by the second detector, aligned with the transmission line of the etalon, as detected by the first detector. In this manner, the laser is kept locked on the absolute wavelength of the selected ITU channel. Routine wavelength locking feedback techniques may be employed to ensure reliable wavelength locking. Simultaneously, at step 509, any drift in the temperature of the etalon is detected and the temperature of the etalon is automatically adjusted by the microcontroller to compensate for the drift. Temperature detectors are mounted to the etalon and routine feedback techniques are employed to keep the temperature of the etalon fixed.

The wavelength-locking technique of FIG. 9 is effective, in part, because the etalon is more stable than the laser and hence it can be assumed that any short-term drift is caused by a variation in the output wavelength of the laser and not by drift in the transmission wavelengths of the etalon. Eventually, the transmission lines of the etalon may begin to drift despite the precise temperature control of the etalon. Hence, periodically, the system is recalibrated at step 510 by using the wavelength mapper to again tune the laser to the absolute wavelength of the selected transmission channel. As described above, wavelength mapping employs a gas absorption chamber providing absorption lines at known absolute wavelengths that remain fixed despite changes in temperature, pressure etc. After re-calibration, the steps of FIG. 9 are repeated to again align one of the transmission lines of the etalon with the transmission wavelength of the laser and to then lock the laser to the etalon transmission line. Recalibration may be performed, for example, once every week or month depending upon the needs of the specific system. In this regard, routine experiments are performed prior to installation of the system to determine the stability of the transmission lines of the etalon and then the system is re-calibrated as often as needed to ensure that no significant drift occurs in the etalon. The system may be implemented with both the wavelength locker and wavelength mapper such that recalibration can be performed as frequently as needed. Alternatively, the portable wavelength mapper described above is employed.

Figure 11:
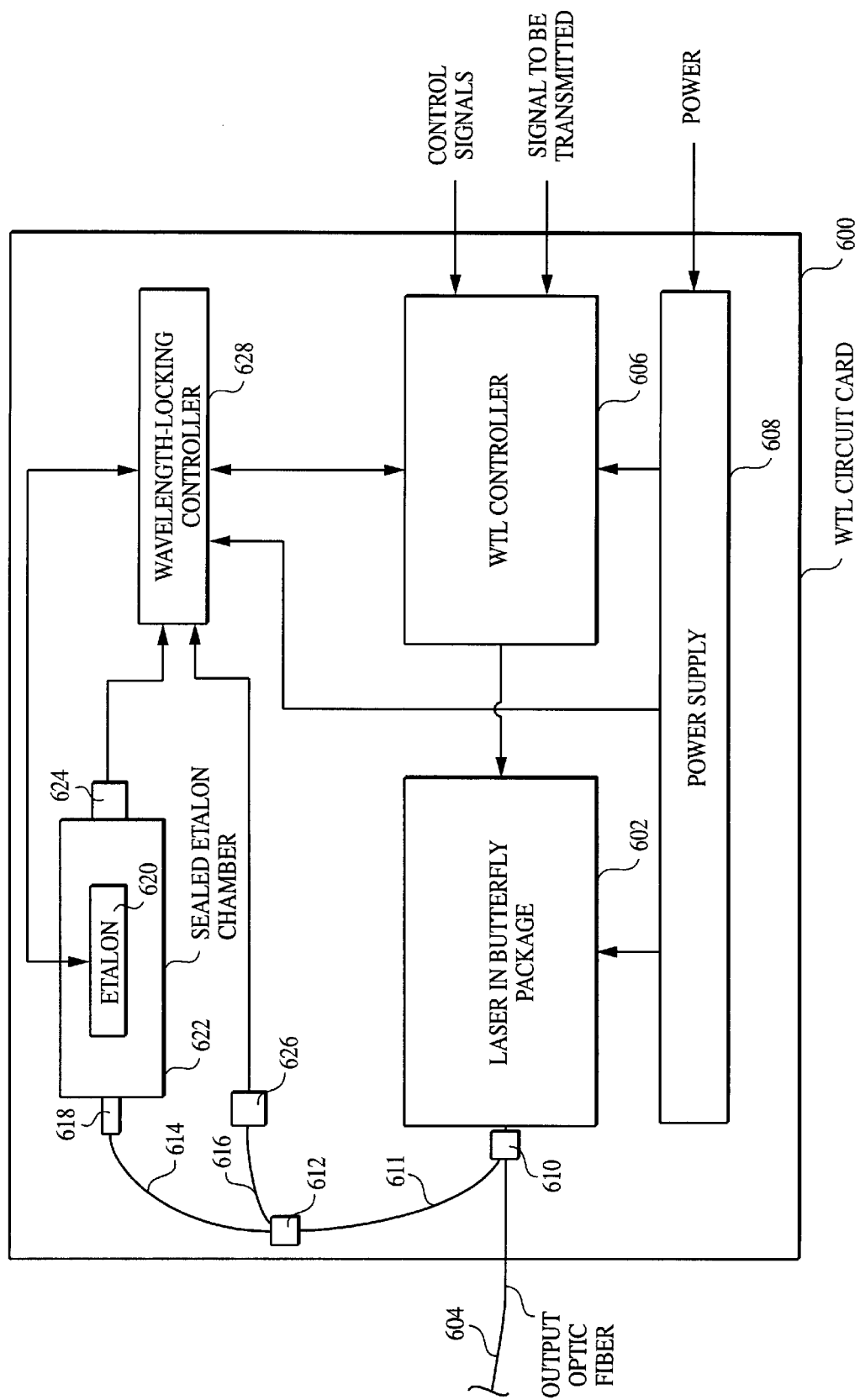
FIG. 11 illustrates a first exemplary embodiment of a WTL circuit card for use in a DWDM wherein the card has a laser mounted within a butterfly package and a wavelength locker having a temperature-controlled etalon for use in locking the laser to an ITU channel wavelength using the method of FIG. 9.

Various specific implementations will now be described with respect to the remaining figures. FIG. 11 illustrates a WTL circuit board card 600 for insertion into a DWDM chassis. Typically, one card is provided per transmission channel of the DWDM. Hence, a forty channel DWDM includes forty of the circuit cards, mounted in parallel. WTL card 600 has a transmission laser mounted within a conventional butterfly package 602 for transmitting a modulated output beam via an output optic fiber 604. The output beam of the fiber 604 is merged with beams from other WTL cards of the DWDM via a multiplexer for eventual transmission via a single optic fiber to a remote DWDM receiver. Digital signals to be transmitted via the output beam and control signals specifying the transmission wavelength to be used are received by a WTL controller 606, which tunes the laser of butterfly package 602 to the transmission wavelength and then controls a signal modulator of the butterfly package to modulate the signal on the output beam. To tune the laser to the selected transmission wavelength, the WTL employs a wavelength map stored in an internal memory (not separately shown), which specifies the tuning parameters (i.e. the control voltage) to apply to the laser to achieve the selected transmission wavelength. The wavelength map is initially generated by a portable wavelength mapper of the type described above and transferred to the WTL controller memory. The WTL controller accesses the stored wavelength map to lookup the tuning parameters based on the input transmission wavelength. Alternatively, the WTL controller directly receives the appropriate tuning parameters via the input control signal and hence need not store the wavelength map. The butterfly package and its internal components can be entirely conventional and will not be described in detail herein. In FIG. 11, the butterfly package is shown in block diagram form with a single input control line from the WTL controller and a single input power line from a power supply 608. In actuality, the butterfly package has numerous pins for receiving control signals from the controller and power from the power supply. The power supply also supplies power to the two microcontrollers of the circuit card.

To provide wavelength locking, a portion of the output beam from the laser is split from optic fiber 604 by a splitter 610 onto another optic fiber 611, then split again by splitter 612 onto optic fibers 614 and 616. Fiber 616 is coupled to a collimator 618, which directs a collimated beam through a temperature-controlled etalon 620 mounted within a sealed chamber 622. The etalon splits the beam into a set of transmission lines or fringes that are detected by a detector 624. Fiber 618 is coupled directly to a second detector 626. A wavelength-locking controller 628 receives signals from the two detectors and, using the method described above, adjusts the etalon to align one of the transmission lines to have the same wavelength as the output beam, then controls the laser (via controller 606) in a feedback loop to lock the laser to the etalon line. To adjust the etalon, the wavelength-locking controller controls an amount of current applied to resistive heating elements coupled to the etalon so as to adjust the temperature of the etalon and thereby adjust its length and index of refraction and hence adjust the wavelength maxima where transmission lines or fringes are generated by the etalon. Once the etalon has been adjusted to align a transmission line to the selected ITU channel, the wavelength-locking controller thereafter keeps the temperature of the etalon fixed so that the wavelength of the transmission line of the etalon does not drift. To control the laser, the wavelength-locking controller transmits control signals to the WTL controller, which cause the WTL controller to increase or decrease the control voltage applied to the laser of the butterfly package so as to adjust the wavelength of the output beam of the laser. The control signals provided by the wavelength-locking controller override those previously received by the WTL controller. Eventually, the components of the circuit card is recalibrated using the portable wavelength mapper to provide a new wavelength map for storage within the WTL controller or to provide new control signals so that any drift in the etalon can be compensated.

Figure 12:
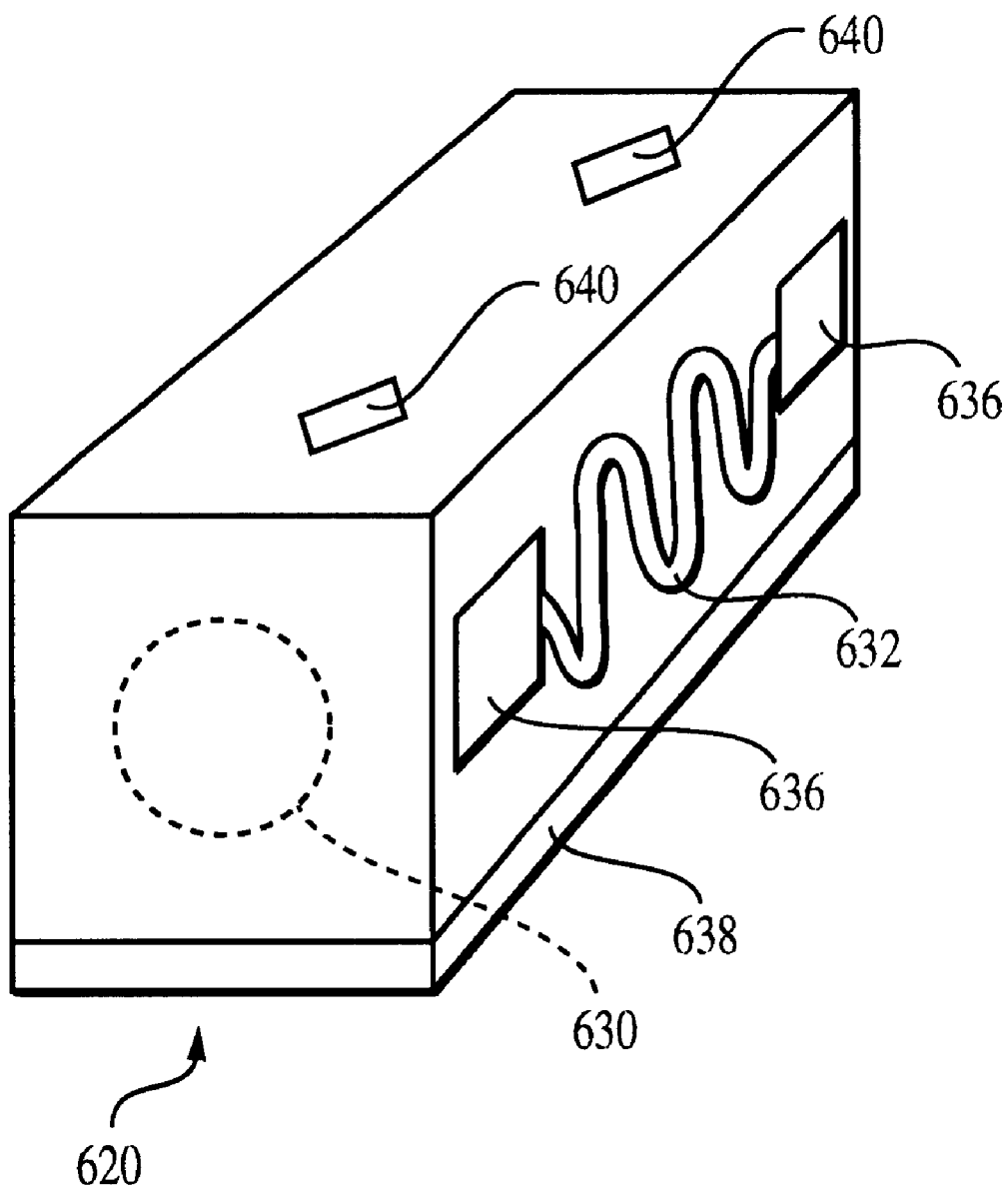
FIG. 12 is a perspective view of the temperature-controlled etalon of the wavelength locker of FIG. 11.

Etalon 620 is shown in FIG. 12. The etalon is a rectangular block formed of silicon and having an optical axis length of about 5.36 mm and a cross-section of about 3 mm by 3 mm and anti-reflection coatings on both faces providing up to 90% reflection at the desired wavelength range. The etalon thereby accommodates a beam width (shown in phantom lines and identified by reference numeral 630) of up to 3 mm. However, it is preferred that the laser beam to be passed through the etalon be collimated to have a width of about 1 mm such that, if the side edges of etalon are not precisely formed, edges of the beam will not be affected. The etalon has finesse in the range of 15 to 30 and preferably about 20 and provides a free spectral range in the range of 6 to 12 and preferably about 8 GHz. Finesse relates to the precision of the individual transmission lines 507 (FIG. 10) generated by the etalon and depends primarily on the reflection coatings, and beam quality. If the finesse is too poor then it is difficult to achieve precise wavelength locking. Free spectral range relates to the wavelength spacing between adjacent transmission lines and depends primarily on the length of the etalon and its index of refraction. If the free spectral range is too great, then it may be necessary to heat or cool the etalon substantially to adjust one of the transmission lines until it is aligned with the selected transmission wavelength and hence power consumption is not minimized. Also, the etalon may need to be heated by an amount that will place the temperature of the etalon outside of an acceptable operational temperature range of the entire device, such as above a mandated maximum temperature of 75 degrees C. for the entire circuit card. If the free spectral range is too small then there is a risk that the wavelength locker may lock the transmission wavelength of the laser to the wrong etalon transmission line, i.e. frequency hopping may occur. The finesse of 20 and the free spectral range of 8 GHz are preferred parameters because, with these parameters, the etalon can be used to lock the wavelength of the laser to within a precision of about 0.2 GHz with minimal risk of frequency hopping and with minimal power consumption while permitting the etalon to operate at over 75 degrees C. By achieving a precision of 0.2 GHz, the wavelength locker can be used with all ITU transmission protocols from 40 channels up to 1000 channels or more and can be used with all ITU transmission rates from 2.5 GHz to 100 GHz. Although a finesse of 20 and a free spectral range of 8 GHz are preferred, the etalon may also be configured to have other specific combinations of parameters depending upon the needs of particular systems. Also, the etalon can alternatively be made of other materials such as sapphire or indium phosphide, with the etalon configured as needed to achieve a desired finesse and free spectral range.

Two resistive heating elements 632 and 634 (not shown) made of nickel chromium are vapor deposited or mounted on opposing sides of the etalon. Each resistive heating element has a pair of gold contacts 636 on opposing ends thereof for coupling to electrical leads (not shown) from the wavelength-locking controller 628 (FIG. 11). The etalon is selectively heated by the wavelength-locking controller by applying current through the resistive leads by an amount sufficient to expand or contract the optical axis of the etalon to change its index of refraction and to align one of the transmission lines of the etalon with the selected ITU channel. With the parameters mentioned above, any C-band ITU channel can be accommodated by adjusting the temperature of the etalon in the range of approximately 72±2 degrees C. No TE cooler or other cooling components are required. Rather, cooling is achieved by allowing the etalon to slowly lose heat to the ambient environment. In the alternative, rather than using resistive heating elements to vary the length of the entire etalon, a reflective micro-electrical mechanical system (MEMS) membrane may be mounted to an end of the etalon and coupled to the wavelength-locking controller to permit the controller to adjust an optical reflecting path of the etalon to thereby adjust the wavelengths of the transmission lines of the etalon.

To prevent the temperature-controlled etalon from losing heat too quickly, and to thereby minimize power losses and ensure temperature stability, the etalon is mounted within an airtight chamber (622 of FIG. 11) and is affixed to a base of the chamber by a bonding material 638 having insulating microspheres. By sealing the etalon in the airtight chamber, heat losses due to circulating air are minimized. The chamber may be filled with air or any other gas that provides a relatively low thermal conductivity and is substantially non-reactive and therefore does not corrode the etalon and its components. Another suitable gas is krypton gas. Air is preferred in the embodiment of FIG. 12 as it provides adequate thermal conductivity and is inexpensive to use. By mounting the etalon using a bonding material employing insulating microspheres, heat loss via conduction into the base of the chamber is minimized. This is particularly important because heat loss to the chamber base could result in a temperature gradient within the etalon, i.e. the bottom of the etalon could be cooler that the top. Any temperature gradient within the etalon decreases the finesse of the etalon and thereby can make it more difficult to precisely align a transmission line of the etalon with a selected ITU channel. A preferred bonding material is described in U.S. Pat. No. 4,888,634 to Lai, et al., issued Dec. 19, 1989 and entitled "High Thermal Resistance Bonding Material And Semiconductor Structures Using Same", which is incorporated by reference herein. The bonding material of U.S. Pat. No. 4,888,634 includes a binder and a high thermal resistance material in the form of sieved particles of generally uniform size. The binder is silicone, epoxy or polyimide and the high thermal resistance material is formed of glass microspheres, glass beads, ceramic microspheres, or ceramic beads.

A uniform temperature in the etalon is also facilitated by ensuring that the resistive heating elements cover a substantial portion of the opposing sides of the etalon. The heating elements are offset slightly from top and bottom edges of the etalon to ensure proper and uniform contact with the etalon even if the edges of the etalon are not precisely formed. Once the etalon has been heated so as to align one of the transmission lines of the etalon with the selected ITU transmission wavelength, the wavelength-locking controller keeps the transmission line aligned by detecting the temperature of the etalon using one or more temperature detectors 640 and adjusting the current applied to the etalon as needed to keep the temperature constant. Eventually, as noted above, the transmission line of the etalon may nevertheless drift and hence the aforementioned periodic recalibration is performed.

Thus, FIGS. 11-12 illustrates one exemplary embodiment of the WTL circuit card of the invention. Various other exemplary embodiments will now be described with reference to FIGS. 13-16. The embodiments of FIGS. 13-16 are similar to that of FIGS. 11 and 12 and only pertinent difference will be described.

Figure 13:
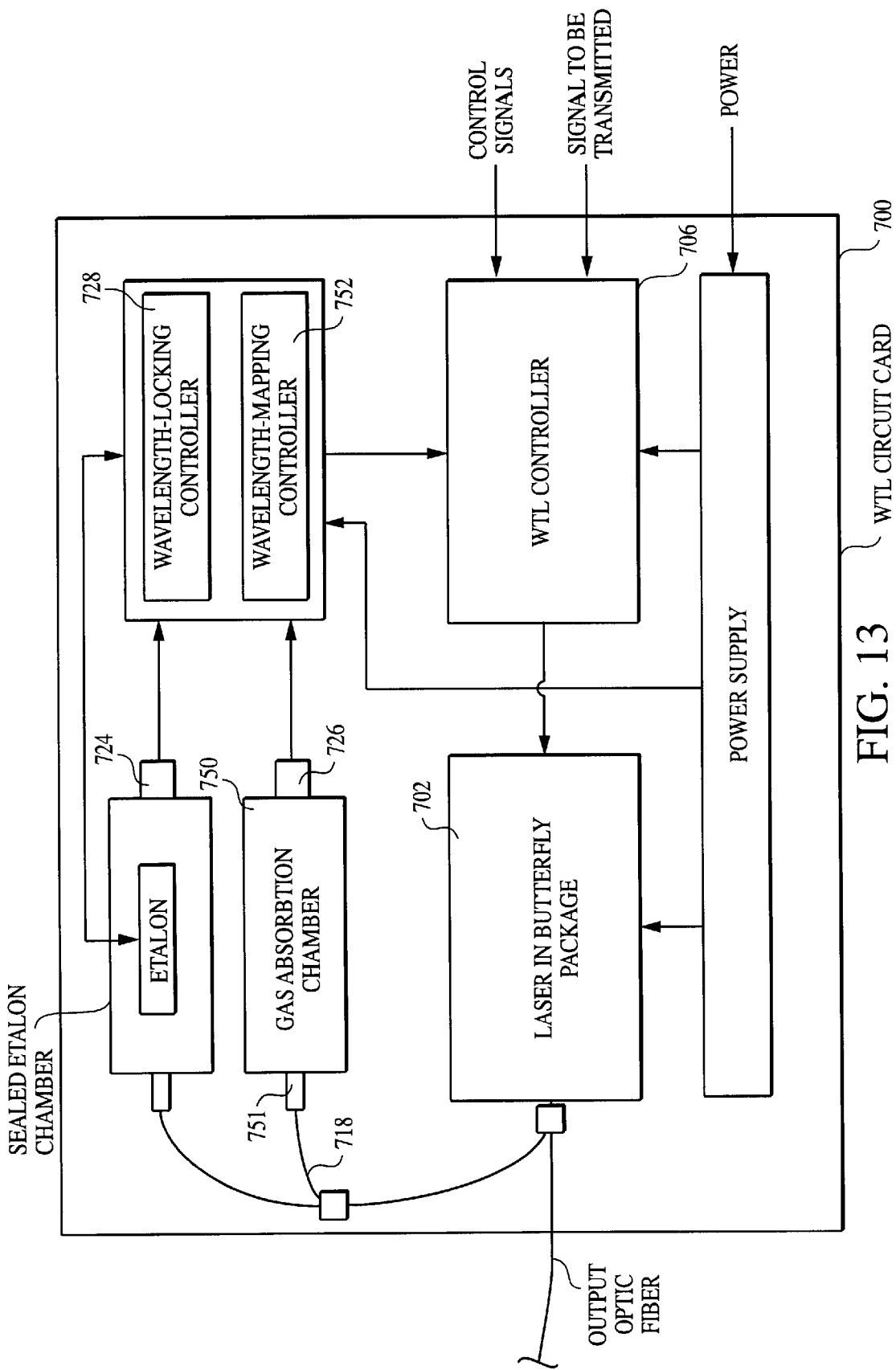
FIG. 13 illustrates a second exemplary embodiment of the WTL circuit card wherein, in addition to the wavelength locker, the card also has a wavelength mapper with a gas absorption chamber for use in mapping the laser to determine absolute transmission wavelengths of the laser prior to wavelength locking.

FIG. 13 illustrates a WTL circuit card 700 that includes both wavelength-locking components and wavelength-mapping components. The wavelength-mapping components include a gas absorption chamber 750 containing a gas of known absorption characteristics such as acetylene, hydrogen cyanide or carbon dioxide. The gas absorption chamber is mounted between optic fiber 718 and detector 726. A collimator 751 is provided at the end of fiber 718 for collimating a beam received from fiber 718 and directing the beam passed through the gas absorption chamber. Hence, a portion of the output beam of the laser of butterfly package 702 is passed through the gas absorption chamber. A wavelength-mapping controller 752 receives signals from both detector 726 and detector 724 and, using the wavelength-mapping techniques described above, maps the absolute transmission wavelengths of the laser by determining the laser tuning parameters associated with each absolute transmission wavelength of the laser, at least within a tuning range of interest, for storage within the WTL controller 706. Thereafter, upon receipt of a control signal specifying an ITU channel for transmission, the WTL controller looks up the tuning parameters and controls the laser to transmit signals on the ITU channel. The wavelength-locking controller 728 operates to keep the laser locked on the ITU channel. Periodically, wavelength-mapping is performed to recalibrate the system. By providing wavelength-mapping components along with wavelength-locking components, recalibration can be performed as often as desired.

Note that, in the embodiment of FIG. 13, detector 726 is used to detect the gas absorption spectrum for wavelength-mapping purposes and also to detect the laser beam for wavelength-locking purposes. When performing wavelength mapping the wavelength of the laser is tuned through its full range of tuning parameters to generate the gas absorption spectrum. When performing wavelength locking, the wavelength of the laser remains substantially fixed, subject only to minor drift, which is compensated for by the wavelength-locking components. Hence, during wavelength-locking, the gas of the gas absorption chamber may absorb a portion of the light of the laser beam at the wavelength the laser is being locked to. This is not typically a problem because the gas only absorbs a portion of the beam, leaving a sufficient portion for detection to permit wavelength locking. If desired, three detectors may be provided: one for the etalon, one for the gas absorption chamber, and one for directly receiving a portion of the output beam of the laser, so that wavelength locking may be performed without using the beam passed through the gas absorption chamber.

Figure 14:
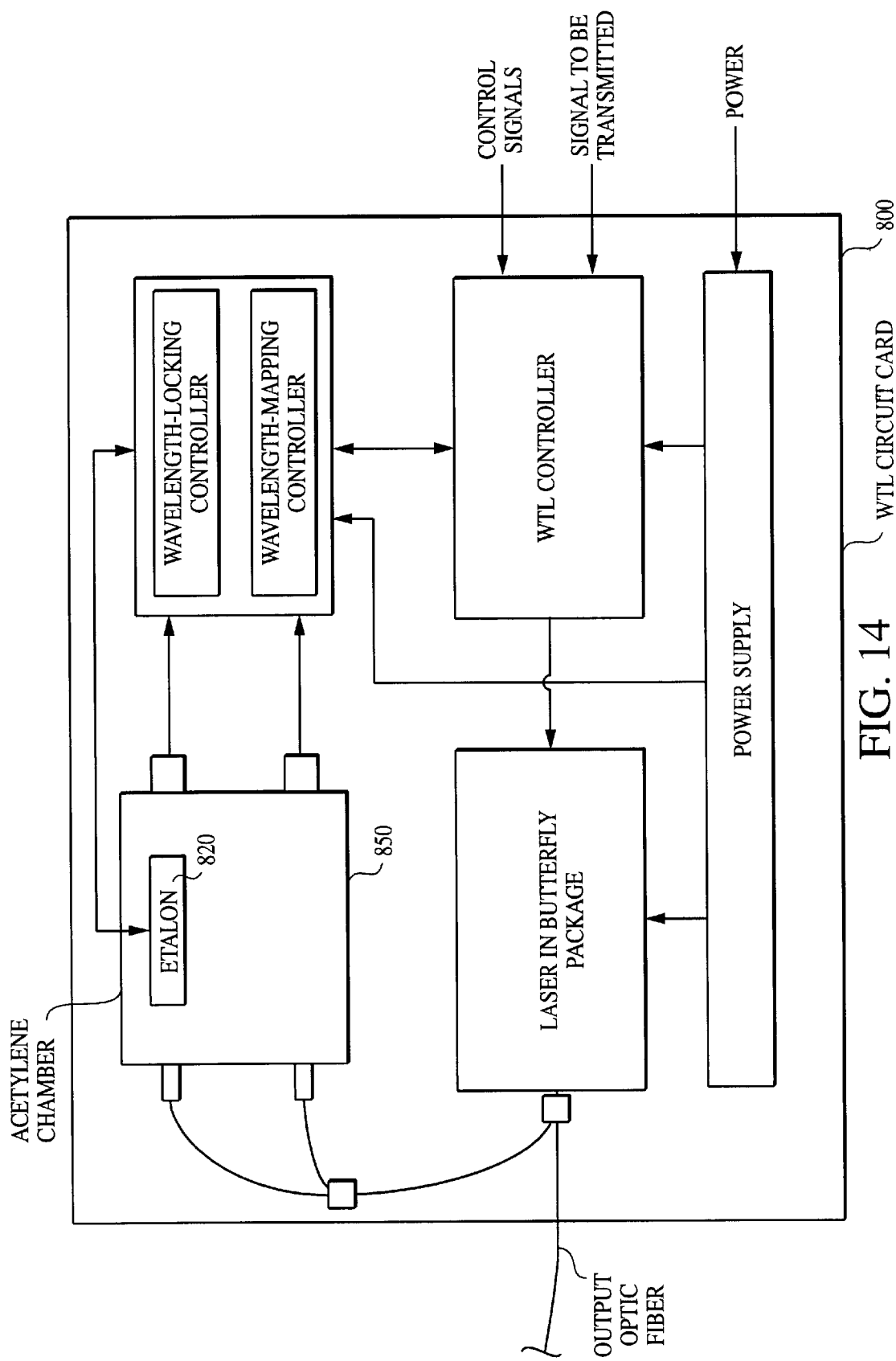
FIG. 14 illustrates a third exemplary embodiment of the WTL circuit card wherein etalon of the wavelength locker is mounted within the gas absorption chamber of the wavelength mapper.

FIG. 14 illustrates another WTL circuit card 800 having both wavelength locking components and wavelength mapping components, but wherein an etalon 820 is mounted within a gas absorption chamber 850 such that separate chambers need not be provided for the etalon and the absorption chamber. The gas absorption chamber contains acetylene, with the acetylene acting both as an absorptive gas for wavelength-mapping purposes and as an insulating gas for the purposes of reducing heat loss from the etalon. The WTL circuit card is operated in the same manner as the circuit card of FIG. 13 to provide both wavelength-mapping and wavelength-locking. By mounting the etalon within the gas absorption chamber, overall device size can be reduced.

Figure 15:
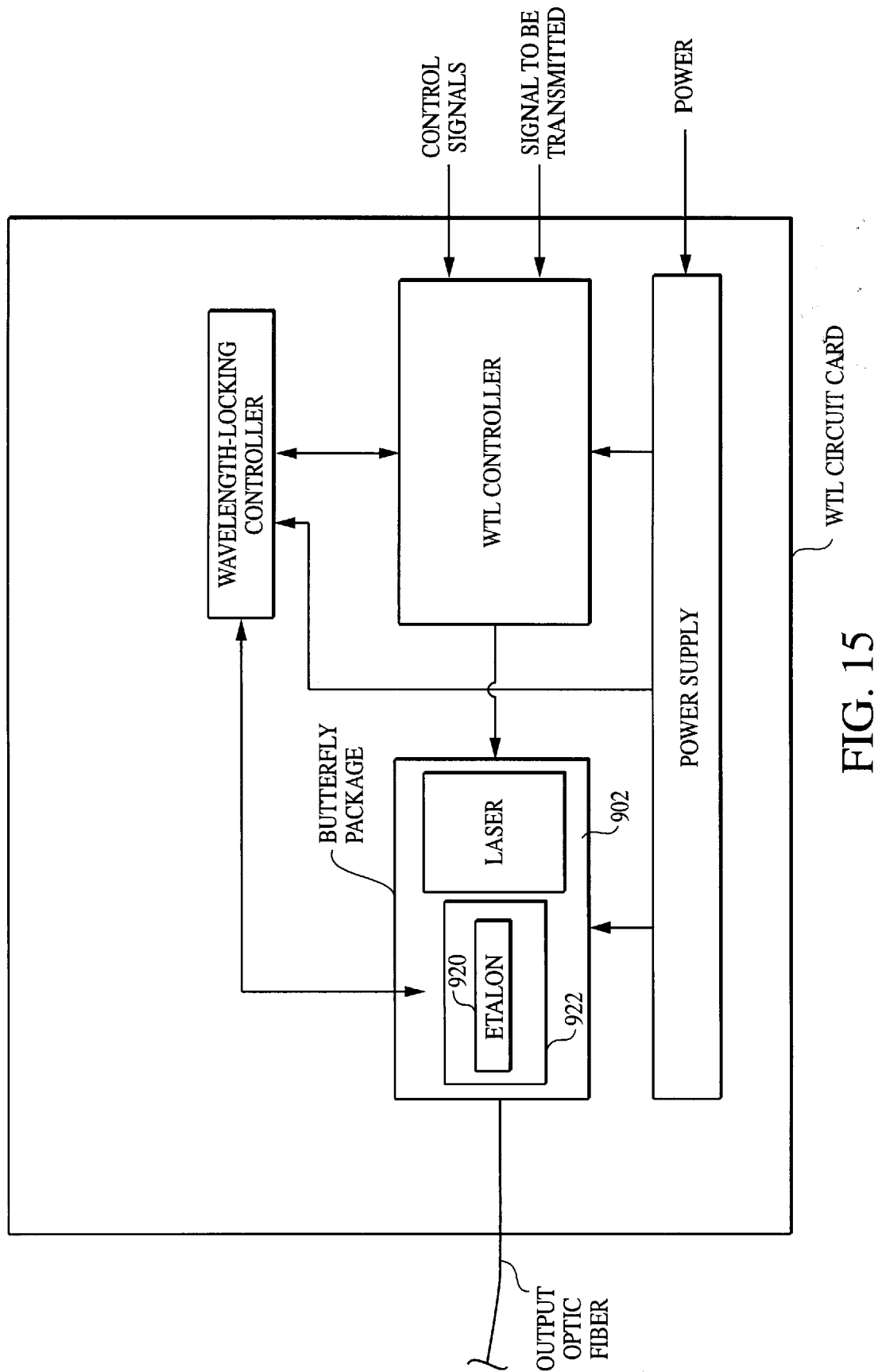
FIG. 15 illustrates a fourth exemplary embodiment of the WTL circuit card wherein an etalon chamber is mounted within the butterfly package along with the laser for use in wavelength locking the laser.

FIG. 15 illustrates a WTL circuit card 900 having wavelength locking components wherein the etalon 920 and its sealed chamber 922 are mounted inside the butterfly package 902. Conventional butterfly packages typically have sufficient unoccupied interior volume to accommodate an etalon of the size described above. If needed, the butterfly package can be made larger to accommodate the etalon chamber. If so, the conventional pin out arrangement of the butterfly package is preferably retained so that the modified butterfly package can be used in conventional WTL circuit cards without further circuit card modification. Also, depending upon the specific implementation, it may be possible to mount the etalon directly in the butterfly package without an etalon chamber. The use of an etalon chamber to enclose the etalon, however, is preferred as it permits more precise control of the temperature of the etalon and reduces the risk that heat from the etalon might affect the functioning of the laser. In any case, by mounting the etalon inside the butterfly package, overall device size is further reduced.

Figure 16:
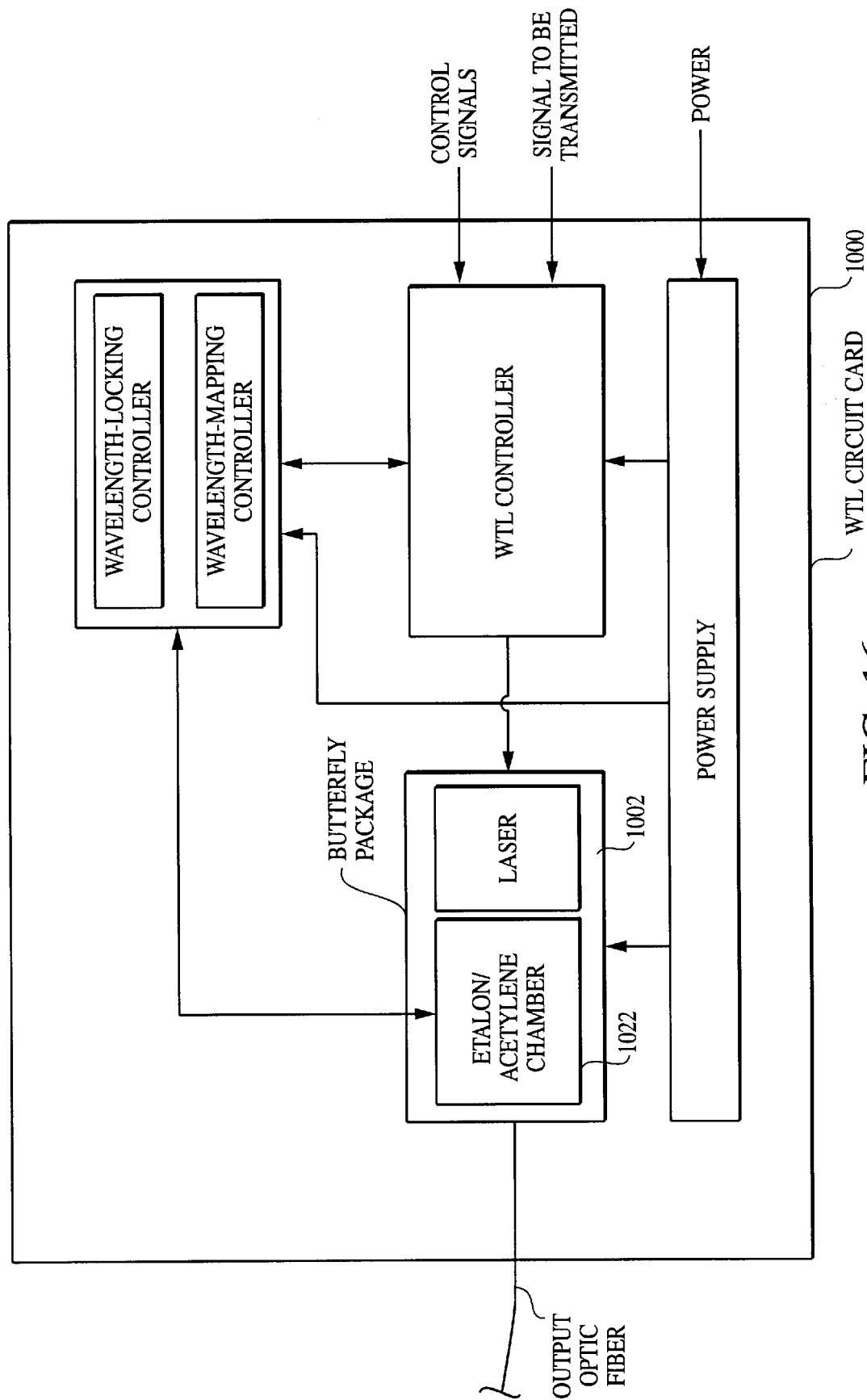
FIG. 16 illustrates a fifth exemplary embodiment of the WTL circuit card wherein a combined etalon/gas absorption chamber is mounted within the butterfly package along with the laser for use in wavelength mapping and wavelength locking the laser.

FIG. 16 illustrates another WTL circuit card 1000 wherein an etalon chamber 1022 is mounted within the butterfly package 1002, but wherein the etalon chamber also contains acetylene so as to function as a gas absorption chamber as well. The WTL circuit card is operated in the same manner as the circuit card of FIG. 14 to provide both wavelength-mapping and wavelength-locking. By mounting the etalon within the gas absorption chamber and mounting the gas absorption chamber inside the butterfly package, overall device size is still further reduced.

The exemplary embodiments have been primarily described with reference to block diagrams illustrating pertinent components of the embodiments. It should be appreciated that not all components of a complete implementation of a practical system are necessarily illustrated or described in detail. Rather, only those components necessary for a thorough understanding of the invention have been illustrated and described in detail. Actual implementations may contain more components or, depending upon the implementation, fewer components.

It will, of course, be understood that modifications to the preferred embodiments will be apparent to those skilled in the art. For example, other reflective surfaces, such as a MEMS mirror, could be utilized to vary the FSR and fringe position. Consequently, the scope of the present invention should not be limited by the particular embodiments discussed above, but should be defined only by the claims set forth below and equivalents thereof.

What is claimed is:

1. A system for locking a transmission wavelength of a laser to a selected wavelength comprising:
    a laser wavelength detector for detecting a transmission wavelength of the output beam of the laser;
    an etalon for splitting a portion of the output beam of the laser into a series of transmission lines;
    an etalon wavelength detector for detecting the etalon transmission lines; and
    a control unit for setting the transmission wavelength of the output beam of the laser to a selected wavelength and also for tuning the etalon to align a selected one of the etalon transmission lines to the selected wavelength, the wavelength-locking control unit thereafter detecting any drift of the transmission wavelength of the laser from the selected etalon transmission line and adjusting the laser to compensate for any drift such that the output beam of the laser is locked to the selected transmission wavelength so long as the selected etalon transmission line remains at the selected wavelength.

2. The system of claim 1 further including:
    a gas absorption chamber;
    an optical element for routing a portion of the output beam from the laser through the gas absorption chamber to generate gas absorption spectrum; and
    a detector for detecting the gas absorption transmission spectrum;
    a wavelength-mapping control unit for tuning the laser through a range of tuning parameters while the output beam from the laser is routed through the etalon and through the gas cell to produce an etalon transmission spectrum as a function of the laser tuning parameters and to produce a gas absorption spectrum as a function of the laser tuning parameters; and
    an absolute transmission wavelength determination unit operative to compare the detected etalon transmission spectrum with the detected gas absorption spectrum to determine the absolute transmission wavelength of the laser as a function of the laser tuning parameters.

3. The system of claim 2 wherein the etalon is mounted within the gas absorption chamber and the chamber is filled with acetylene.

4. The system of claim 2 further including:
    a transmission wavelength input selection unit; and
    wherein the absolute transmission wavelength determination unit determines the particular tuning parameters needed to tune the laser to a selected transmission wavelength based on the absolute transmission wavelength of the laser and wherein the control unit operates to tune the transmission laser to the selected wavelength using the particular tuning parameters.

5. The system of clam 1 further including a heating element mounted to the etalon and coupled to the wavelength-locking control unit for heating the etalon under control of the wavelength-locking control unit.

6. The system of clam 5 wherein the heating element includes a first heating strip mounting parallel to an optic axis of the etalon along one side thereof and a second heating strip mounting parallel to an optic axis of the etalon along an opposing side thereof.

7. The system of clam 6 wherein the etalon has a rectangular cross section and wherein side edges of the heating elements are offset from adjacent corner edges of the etalon.

8. The system of claim 1 wherein the wavelength for transmission is selected from a group of predetermined International Telecommunication Industry (ITU) fiber optic transmission grid lines.

9. The system of claim 1 wherein the etalon is a temperature-controlled etalon.

10. The system of claim 9 wherein the temperature-controlled etalon is configured to have a finesse in the range of 15-30 and a free spectral range in the range of 6 GHz to 12 GHz.

11. The system of claim 10 wherein the temperature-controlled etalon is silicon, sapphire or indium phosphide.

12. The system of claim 10 wherein the temperature-controlled etalon has an optical axis length of is in the range of about 4 to 7 mm.

13. The system of claim 10 wherein the temperature-controlled etalon is a silicon etalon having an optical axis length of about 5.36 mm and configured to have a finesse of about 20 and a free spectral range of about 8 GHz.

14. The system of claim 1 further including a sealed chamber enclosing the etalon, the chamber being filled with a gas including one or more of air, krypton gas, $H^{13}CN$, or acetylene.

15. The system of claim 1 wherein the etalon is mounted to a substrate using a bonding material including a binder and a high thermal resistance material.

16. A method for controlling a laser using a tunable etalon, the method comprising the steps of:
    tuning the laser to transmit at a selected transmission wavelength;
    tuning the etalon to align a transmission line of the etalon with the selected transmission wavelength;
    detecting any drift of the transmission wavelength of the laser from the etalon transmission line; and
    adjusting the laser to compensate for any drift such that the output beam of the laser is locked to the selected transmission wavelength so long as the selected etalon transmission line remains at the selected wavelength.

17. The method of claim 16 further including the initial step of calibrating absolute transmission wavelengths of the laser using gas absorption lines for a known gas.

18. The method of claim 17 wherein the step of calibrating the absolute transmission wavelengths of the laser using gas absorption lines for a known gas includes the steps of:
    routing an output beam from the laser through the etalon while tuning the laser through a range of tuning parameters to produce an etalon transmission spectrum as a function of the laser tuning parameters;
    routing an output beam from the laser through a gas cell containing the known gas while tuning the laser through the range of tuning parameters to produce a gas absorption spectrum as a function of the laser tuning parameters;
    detecting the etalon transmission spectrum and the gas absorption spectrum; and
    comparing the detected etalon transmission spectrum with the detected gas absorption spectrum to calibrate the absolute transmission wavelength of the laser as a function of the laser tuning parameters.

19. The method of claim 16 wherein the wavelength for transmission is selected from a group of predetermined International Telecommunication Industry (ITU) fiber optic transmission grid lines.

20. The method of claim 16 further including the initial step of providing a temperature-controlled etalon configured to have a finesse in the range of 15-30 and a free spectral range in the range of 6 GHz to 12 GHz.

21. The method of claim 20 wherein the temperature-controlled etalon is configured to have a finesse of about 20 and a free spectral range of about 8 GHz.

22. The method of claim 16 further including the initial step of providing a temperature-controlled etalon formed of silicon, sapphire or indium phosphide.

23. The method of claim 22 wherein the etalon is fabricated from silicon.

24. The method of claim 16 further including the initial step of providing a temperature-controlled etalon having an optical axis length in the range of about 4 to 7 mm.

25. The method of claim 24 wherein the etalon is configured to have an optical axis length of about 5.36 mm.

26. The method of claim 16 further including the initial step of mounting the etalon to a substrate using a bonding material including a binder and a high thermal resistance material in the form of sieved particles of generally uniform size.

27. The method of clam 16 further including the initial step of preparing a binder formed of silicone, epoxy or polyimide.

28. The method of clam 26 further including the initial step of preparing a high thermal resistance material formed of glass microspheres, glass beads, ceramic microspheres, or ceramic beads.

29. A system for controlling a laser, the system comprising:
    means for tuning the laser to transmit at a selected transmission wavelength;
    interference means for splitting a portion of an output beam of the laser into a series of substantially uniformly-spaced transmission lines;
    means for adjusting the means for splitting to align a selected transmission line of the series of transmission lines with the selected transmission wavelength;
    means for detecting any drift of the transmission wavelength of the laser from the selected transmission line; and
    means for adjusting the laser to compensate for any drift such that the output beam of the laser is locked to the selected transmission wavelength so long as the selected transmission line remains at the selected wavelength.

30. The system of claim 29 further including means for calibrating absolute transmission wavelengths of the interference means using gas absorption lines for a known gas.

31. The system of claim 30 wherein the means for calibrating the absolute transmission wavelengths of the interference means using gas absorption lines for a known gas includes:
    means for routing an output beam from the laser through the interference means while tuning the laser through a range of tuning parameters to produce an interference means transmission spectrum as a function of the laser tuning parameters;
    means for routing an output beam from the laser through a gas cell containing the known gas while tuning the laser through the range of tuning parameters to produce a gas absorption spectrum as a function of the laser tuning parameters;
    means for detecting the interference means transmission spectrum and the gas absorption spectrum; and
    means for comparing the detected interference means transmission spectrum with the detected gas absorption spectrum to calibrate the absolute transmission wavelength of the interference means as a function of the interference means tuning parameters.

32. The system of claim 29 wherein the interference means is configured to provide a finesse in the range of 15-30 and a free spectral range in the range of 6 GHz to 12 GHz.

33. The system of claim 36 wherein the interference means is configured to provide a finesse of about 20 and a free spectral range of about 8 GHz.

* * * * *